United States Patent
Guo et al.

(10) Patent No.: US 12,048,229 B2
(45) Date of Patent: *Jul. 23, 2024

(54) DISPLAY PANEL AND DISPLAY APPARATUS

(71) Applicant: BOE TECHNOLOGY GROUP CO., LTD., Beijing (CN)

(72) Inventors: Yuzhen Guo, Beijing (CN); Xiaochuan Chen, Beijing (CN); Lei Wang, Beijing (CN); Haisheng Wang, Beijing (CN); Yingming Liu, Beijing (CN); Lijun Zhao, Beijing (CN); Changfeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/182,894

(22) Filed: Mar. 13, 2023

(65) Prior Publication Data

US 2023/0217785 A1    Jul. 6, 2023

Related U.S. Application Data

(63) Continuation of application No. 17/041,915, filed as application No. PCT/CN2019/128345 on Dec. 25, 2019, now Pat. No. 11,653,548.

(30) Foreign Application Priority Data

Jan. 30, 2019 (CN) .......................... 201910093793.9

(51) Int. Cl.
*H10K 59/35* (2023.01)
*G06V 40/13* (2022.01)
(Continued)

(52) U.S. Cl.
CPC ......... *H10K 59/65* (2023.02); *G06V 40/1318* (2022.01); *H10K 59/353* (2023.02); *H10K 59/60* (2023.02)

(58) Field of Classification Search
CPC ........................... H10K 59/65; G06V 40/1318
See application file for complete search history.

(56) References Cited

U.S. PATENT DOCUMENTS 5,666,177 A     9/1997  Hsieh et al.
11,152,432 B1 * 10/2021  Liu ...................... H10K 59/353
(Continued)

FOREIGN PATENT DOCUMENTS

CN     103685992 A    3/2014
CN     103716558 A    4/2014
(Continued)

OTHER PUBLICATIONS

Extended European Search Report for corresponding European Application No. 19912815.8, dated Sep. 29, 2022, 8 pages.
(Continued)

*Primary Examiner* — Eric K Ashbahian
(74) *Attorney, Agent, or Firm* — Dority & Manning, P.A.

(57) ABSTRACT

A display panel includes a sub-pixel array and a plurality of photosensitive units. The sub-pixel array includes a first sub-pixel, a second sub-pixel and a third sub-pixel that are capable of emitting light of different colors. The plurality of photosensitive units are disposed under gaps of the sub-pixel array. Each of the plurality of photosensitive units includes a photosensitive device, and the photosensitive device includes a photosensitive layer; and an orthographic projection of the photosensitive layer in the photosensitive device on a panel surface of the display panel has overlapping (Continued)

regions with orthographic projections of the first sub-pixel, the second sub-pixel and the third sub-pixel on the panel surface of the display panel.

14 Claims, 7 Drawing Sheets

(51) Int. Cl.
  *H10K 59/60* (2023.01)
  *H10K 59/65* (2023.01)

(56) References Cited

U.S. PATENT DOCUMENTS

| | | | |
|---|---|---|---|
| 11,653,548 B2 * | 5/2023 | Guo | H10K 59/60 257/40 |
| 2006/0011913 A1 | 1/2006 | Yamazaki | |
| 2017/0047383 A1 | 2/2017 | Hsin | |
| 2017/0255809 A1 | 9/2017 | Huang et al. | |
| 2018/0005007 A1 | 1/2018 | Du et al. | |
| 2018/0019288 A1 | 1/2018 | Yang et al. | |
| 2018/0129852 A1 * | 5/2018 | Zeng | H10K 59/1216 |
| 2018/0175121 A1 | 6/2018 | Ji et al. | |
| 2018/0211079 A1 | 7/2018 | Liu et al. | |
| 2018/0225500 A1 | 8/2018 | Han | |
| 2019/0035322 A1 * | 1/2019 | Kim | G09G 3/3233 |
| 2019/0043408 A1 | 2/2019 | Li et al. | |
| 2019/0384960 A1 | 12/2019 | Kwon et al. | |
| 2020/0044004 A1 | 2/2020 | Wang et al. | |
| 2020/0083302 A1 * | 3/2020 | Park | H10K 50/828 |
| 2020/0144339 A1 | 5/2020 | He et al. | |
| 2020/0335559 A1 | 10/2020 | Xu et al. | |
| 2021/0134896 A1 | 5/2021 | Guo et al. | |

FOREIGN PATENT DOCUMENTS

| | | |
|---|---|---|
| CN | 106775063 A | 5/2017 |
| CN | 106842594 A | 6/2017 |
| CN | 206322697 U | 7/2017 |
| CN | 108511480 A | 9/2018 |
| CN | 108596147 A | 9/2018 |
| CN | 109037276 A | 12/2018 |

OTHER PUBLICATIONS

Supplementary Search from corresponding Chinese Application No. 201910093793.9, filed on Jan. 30, 2019, 1 page.
First Office Action (w/ English translation) for corresponding Chinese Application No. 201910093793.9, dated Jun. 11, 2020, 17 pages.
Office Action (w/ English translation) for corresponding Indian Application No. 202127019546, dated Feb. 18, 2022, 5 pages.
International Search Report and Written Opinion (w/ English Translation) for corresponding PCT Application No. PCT/CN2019/128345, dated Mar. 31, 2020, 18 pages.
Non-Final Office Action for corresponding U.S. Appl. No. 17/041,915, dated Jun. 7, 2022, 18 pages.
Notice of Allowance for corresponding U.S. Appl. No. 17/041,915, dated Jan. 11, 2023, 16 pages.
Corrected Notice of Allowability for corresponding U.S. Appl. No. 17/041,915, dated Jan. 25, 2023, 8 pages.
Indian Hearing Notice for corresponding Indian Application No. 202127019546, dated Feb. 2, 2024, 2 pages.
Japanese Notice of Reasons for Refusal (w/ English translation) for corresponding Japanese Application No. 2020-567204, dated Jan. 23, 2024, 8 pages.

* cited by examiner

DISPLAY PANEL AND DISPLAY APPARATUS

CROSS-REFERENCE TO RELATED APPLICATIONS

This application is a continuation of U.S. patent application Ser. No. 17/041,915, filed on Sep. 25, 2020, which claims priority to International Patent Application No. PCT/CN2019/128345 filed on Dec. 25, 2019, which claims priority to Chinese Patent Application No. 201910093793.9, filed on Jan. 30, 2019, which are incorporated herein by reference in their entirety.

TECHNICAL FIELD

The present disclosure relates to the field of display technologies, and in particular, to a display panel and a display apparatus.

BACKGROUND

In the related art, a recognition device used to collect fingerprints (i.e., a fingerprint recognition device) is usually disposed outside a display area of a display screen. For example, the fingerprint recognition device is integrated in a Home button (i.e., a start button) of a terminal such as a mobile phone, resulting in a low screen-to-body ratio (i.e., a ratio of the display area to the entire front surface of the display screen) of the display screen. In order to further increase the screen-to-body ratio of the display area, a fingerprint recognition technology integrating the fingerprint recognition device in the display area is provided.

SUMMARY

In one aspect, a display panel is provided. The display panel includes: a sub-pixel array and a plurality of photosensitive units. The sub-pixel array includes a first sub-pixel, a second sub-pixel and a third sub-pixel that are capable of emitting light of different colors. The plurality of photosensitive units are disposed under gaps of the sub-pixel array. Each of the plurality of photosensitive units includes a photosensitive device, and the photosensitive device includes a photosensitive layer. An orthographic projection of the photosensitive layer in the photosensitive device on a panel surface of the display panel has overlapping regions with orthographic projections of the first sub-pixel, the second sub-pixel and the third sub-pixel on the panel surface of the display panel.

In some embodiments, an area of an overlapping region between an orthographic projection of each photosensitive layer on the panel surface of the display panel and orthographic projections of first sub-pixels on the panel surface of the display panel is equal. An area of an overlapping region between an orthographic projection of each photosensitive layer on the panel surface of the display panel and orthographic projections of second sub-pixels on the panel surface of the display panel is equal. An area of an overlapping region between an orthographic projection of each photosensitive layer on the panel surface of the display panel and an orthographic projection of the third sub-pixel on the panel surface of the display panel is equal.

In some embodiments, the sub-pixel array includes: a plurality of display groups sequentially arranged in a column direction. Each of the plurality of display groups includes: a first display sub-group and a second display sub-group alternately arranged in sequence in a row direction. Each first display sub-group and each second display sub-group each include: a first sub-pixel, a second sub-pixel and a third sub-pixel distributed in two adjacent rows. In each display group, the first sub-pixel and the second sub-pixel in each first display sub-group are located in a same row as the third sub-pixel in each second display sub-group, and the third sub-pixel in each first display sub-group is located in a same row as the first sub-pixel and the second sub-pixel in each second display sub-group.

In some embodiments, the plurality of photosensitive units are evenly distributed under the gaps of the sub-pixel array.

In some embodiments, each photosensitive layer includes: a first sub-photosensitive layer, a second sub-photosensitive layer, and a third sub-photosensitive layer. A first photosensitive unit is disposed under a gap of each first display sub-group and a second photosensitive unit is disposed under a gap of each second display sub-group. In a direction perpendicular to the panel surface of the display panel, in a first photosensitive unit corresponding to each first display sub-group, the first sub-photosensitive layer overlaps with the third sub-pixel in the first display sub-group and the second sub-pixel in a neighbouring second display sub-group, the second sub-photosensitive layer overlaps with the third sub-pixel in the first display sub-group and the first sub-pixel in another neighbouring second display sub-group, and the third sub-photosensitive layer overlaps with the first sub-pixel and the second sub-pixel in the first display sub-group.

In the direction perpendicular to the panel surface of the display panel, in a second photosensitive unit corresponding to each second display sub-group, the first sub-photosensitive layer overlaps with the third sub-pixel in the second display sub-group and the second sub-pixel in a neighbouring first display sub-group, the second sub-photosensitive layer overlaps with the third sub-pixel in the second display sub-group and the first sub-pixel in another neighbouring first display sub-group, and the third sub-photosensitive layer overlaps with the first sub-pixel and the second sub-pixel in the second display sub-group.

In some embodiments, in the column direction, the third sub-pixel in each first display sub-group and the first sub-pixel and the second sub-pixel in another neighbouring first display sub-group constitute a first virtual sub-group, and the first sub-pixel and the second sub-pixel in each second display sub-group and the third sub-pixel in another neighbouring second display sub-group constitute a second virtual sub-group. A third photosensitive unit is disposed under a gap of each first virtual sub-group and a fourth photosensitive unit is disposed under a gap of each second virtual sub-group.

In the direction perpendicular to the panel surface of the display panel, in a third photosensitive unit corresponding to each first virtual sub-group, the first sub-photosensitive layer overlaps with the third sub-pixel in the first virtual sub-group and the second sub-pixel in a neighbouring second virtual sub-group, the second sub-photosensitive layer overlaps with the third sub-pixel in the first virtual sub-group and the first sub-pixel in another neighbouring second virtual sub-group, and the third sub-photosensitive layer overlaps with the first sub-pixel and the second sub-pixel in the first virtual sub-group. In the direction perpendicular to the panel surface of the display panel, in a fourth photosensitive unit corresponding to each second virtual sub-group, the first sub-photosensitive layer overlaps with the third sub-pixel in the second virtual sub-group and the second sub-pixel in a neighbouring first virtual sub-group, the second sub-photosensitive layer overlaps with the third sub-pixel in the second virtual sub-group and the first sub-pixel in another neighbouring first virtual sub-group, and the third sub-photosensitive layer overlaps with the first sub-pixel and the second sub-pixel in the second virtual sub-group.

In some embodiments, an area of an overlapping region between each first sub-photosensitive layer and a corresponding second sub-pixel is equal, and an area of an overlapping region between each first sub-photosensitive layer and a corresponding third sub-pixel is equal. An area of an overlapping region between each second sub-photosensitive layer and a corresponding first sub-pixel is equal, and an area of an overlapping region between each second sub-photosensitive layer and a corresponding third sub-pixel is equal. An area of an overlapping region between each third sub-photosensitive layer and a corresponding first sub-pixel is equal, and an area of an overlapping region between each third sub-photosensitive layer and a corresponding second sub-pixel is equal.

In some embodiments, in a column of the first display sub-groups, a gap between the first sub-pixel and the second sub-pixel is aligned with a center line of the third sub-pixel in the column direction. In a column of the second display sub-groups, a gap between the first sub-pixel and the second sub-pixel is aligned with a center line of the third sub-pixel in the column direction. In each photosensitive unit, a center of the first sub-photosensitive layer, a center of the second sub-photosensitive layer and a center of the third sub-photosensitive layer are connected to form a virtual triangle. A distance between middle points of two adjacent virtual triangles in the row direction is equal to a distance between middle points of two adjacent virtual triangles in the column direction. A middle point of each virtual triangle is a middle point of a vertical line from a vertex corner where the center of the third sub-photosensitive layer is located to an opposite side.

In some embodiments, in the photosensitive unit, the first sub-photosensitive layer, the second sub-photosensitive layer and the third sub-photosensitive layer included in the photosensitive layer are not connected to each other.

In some embodiments, the photosensitive device in the photosensitive unit further includes: a bottom electrode and a top electrode disposed on both sides of the photosensitive layer in the direction perpendicular to the panel surface of the display panel. Orthographic projections of the first sub-photosensitive layer, the second sub-photosensitive layer and the third sub-photosensitive layer on the panel surface of the display panel are within a range of an orthographic projection of the bottom electrode on the panel surface of the display panel, and portions of the bottom electrode corresponding to the first sub-photosensitive layer, the second sub-photosensitive layer and the third sub-photosensitive layer are connected to each other. Orthographic projections of the first sub-photosensitive layer, the second sub-photosensitive layer and the third sub-photosensitive layer on the panel surface of the display panel are within a range of an orthographic projection of the top electrode on the panel surface of the display panel, and portions of the top electrode corresponding to the first sub-photosensitive layer, the second sub-photosensitive layer and the third sub-photosensitive layer are connected to each other.

In some embodiments, in the direction perpendicular to the panel surface of the display panel, patterns of the first sub-pixel, the second sub-pixel and the third sub-pixel are all hexagons.

In some embodiments, the display panel is a fingerprint recognition display panel.

In some embodiments, the first sub-pixel includes a first light-emitting device, and a portion of the first sub-pixel overlapping with the photosensitive layer is a light-emitting layer of the first light-emitting device in the first sub-pixel. The second sub-pixel includes a second light-emitting device, and a portion of the second sub-pixel overlapping with the photosensitive layer is a light-emitting layer of the second light-emitting device in the second sub-pixel. The third sub-pixel includes a third light-emitting device, and a portion of the third sub-pixel overlapping with the photosensitive layer is a light-emitting layer of the third light-emitting device in the third sub-pixel.

In some embodiments, each first sub-pixel, each second sub-pixel and each third sub-pixel each further include a driving transistor electrically connected to the corresponding light-emitting device. The photosensitive unit further includes a switching transistor electrically connected to the photosensitive device in the photosensitive unit. A material of an active layer in the driving transistor is different from a material of an active layer in the switching transistor, and the active layer in the switching transistor is made of an oxide semiconductor material.

In some embodiments, the active layer in the driving transistor is made of a low-temperature polysilicon material.

In another aspect, a display apparatus is provided. The display apparatus includes any one of the display panel described above.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual dimensions of products, actual processes of methods and actual timings of signals that the embodiments of the present disclosure relate to.

DETAILED DESCRIPTION

Figure 1:
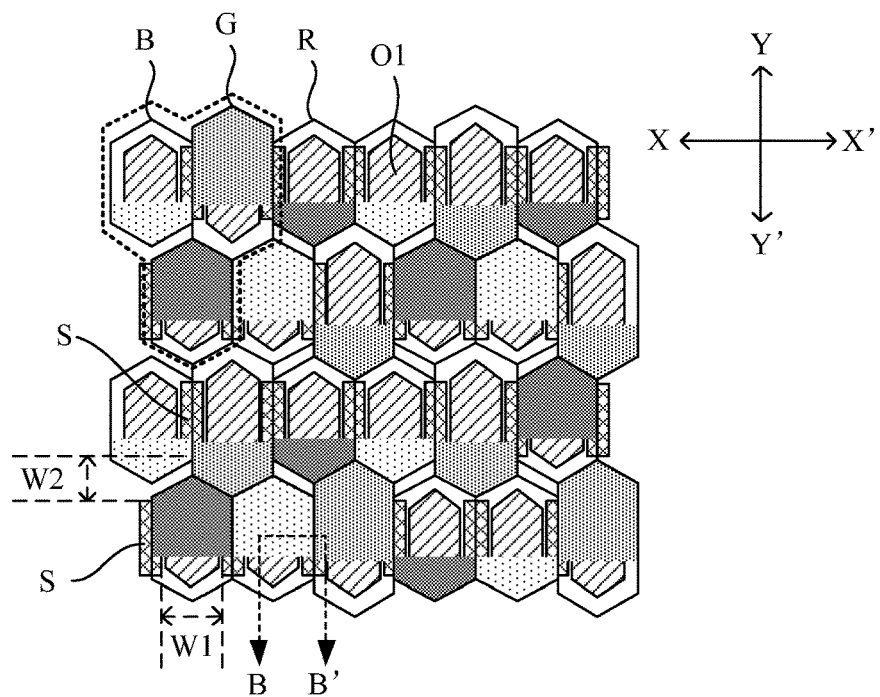
FIG. 1 is a top view of a display panel in the related art.

Technical solutions in some embodiments of the present disclosure will be described clearly and in combination with accompanying drawings below. Obviously, the described embodiments are merely some but not all embodiments of the present disclosure. All other embodiments obtained on a basis of embodiments of the present disclosure by a person of ordinary skill in the art shall be included in the protection scope of the present disclosure.

Unless the context requires otherwise, the term "comprise" and other forms thereof such as the third-person singular forms "comprises" and the present participle forms "comprising" in the description and the claims are construed as an open and inclusive meaning, i.e., "included, but not limited to". In the description, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

The expression "at least one of A, B, and C" has a same meaning as the expression "at least one of A, B, or C", and both include the following combinations of A, B, and C: only A, only B, only C, a combination of A and B, a combination of A and C, a combination of B and C, and a combination of A, B, and C.

Terms such as "first" and "second" are used for descriptive purposes only, and are not to be construed as indicating or implying the relative importance or implicitly indicating the number of indicated technical features below. Thus, features defined by "first" and "second" may explicitly or implicitly include one or more of the features. In the description of the embodiments of the present application, the term "a/the plurality of" means two or more unless otherwise specified.

It will be noted that, unless otherwise defined, all terms (including technical and scientific terms) used in the embodiments of the present disclosure have a same meaning as commonly understood by a person of ordinary skill in the art to which the present disclosure belongs. It will also be understood that, terms such as those defined in an ordinary dictionary should be interpreted as having meanings consistent with their meanings in the context of the related art, and should not be interpreted in an idealized or extremely formalized way unless explicitly defined herein.

For example, terms "including" or "comprising" or the like used in the description and claims of the present disclosure means that a component or item preceding the word covers a component or item enumerated after the word and its equivalent, without excluding other elements or items. Orientations or positional relationships indicated by terms "up/above", "down/under (below)", "row/row direction", "column/column direction" and the like are the orientations or positional relationships shown in the accompanying drawings, and are merely for convenience of explanation of the technical solution of the present disclosure, and are not intended to indicate or imply that a referred device or component must have a particular orientation, and must be constructed and operated in a particular orientation. Therefore, they cannot be construed as limitations to the present disclosure.

For example, in some cases, embodiments involving "row direction" may be implemented in a case of "column direction" and so on, and vice versa. A solution obtained by rotating the solution described in this patent by 90° or mirroring it is also within the scope of this patent.

In the related art, in an under-screen fingerprint recognition apparatus, fingerprint recognition devices integrated in the display area is usually photosensitive units. The under-screen fingerprint recognition technology may integrate the fingerprint recognition devices in a specific region of the display area, or may integrate the fingerprint recognition devices in any region of the display area. The latter is called a full-screen fingerprint recognition technology. Integrating the photosensitive units inside the display panel (i.e., in cell integration) may further make the display panel intelligent and improve a screen-to-body ratio thereof. The photosensitive unit includes a photosensitive device, and the photosensitive device includes a photosensitive layer (also called a light-sensitive layer). The photosensitive layer generates a photoelectric signal by receiving light reflected by ridges and valleys in a surface of a finger. Since the ridges in the surface of the finger are relatively convex and the valleys are relatively concave, intensity of the light reflected by the ridges and valleys is different, which affects the photoelectric signal generated by the photosensitive device. The photoelectric signals generated by a plurality of photosensitive devices are processed, so as to achieve the fingerprint recognition.

However, the display panel has a high display resolution. That is, the display panel has a plurality of sub-pixels that are densely distributed. Therefore, after the photosensitive units are integrated in the display panel, an area of a photosensitive layer in each photosensitive unit is affected by the existing sub-pixels, and actually the photosensitive unit may only have a photosensitive layer with a small area. In this way, compared with an optical fingerprint array that is independently disposed outside the screen, a light receiving area (that is, an area of a region of the photosensitive layer that can receive light) of the photosensitive unit integrated in the display panel may be reduced, resulting in a decrease of the photosensitive electrical signal intensity. Moreover, the sub-pixels in the display area emit light of different colors, which may affect the photosensitive layer receiving light reflected by the finger, thereby reducing recognition accuracy of the photosensitive unit.

In an example where the display panel is an organic light-emitting diode (OLED) display panel, the OLED display panel integrated with the photosensitive units in the related art and an arrangement manner of the photosensitive units that are integrated in the display panel will be described in detail below.

The OLED display panel includes a plurality of sub-pixels arranged in a matrix, and the plurality of sub-pixels are further separated into a plurality of red sub-pixels (hereinafter referred to as R sub-pixels), a plurality of green sub-pixels (hereinafter referred to as G sub-pixels) and a plurality of blue sub-pixels (hereinafter referred to as B sub-pixels). In order to make images displayed on the OLED display panel have better color quality, specifically, the matrix design of the R, G, and B sub-pixels adopts a design of a delta (i.e., a triangle) shape.

As shown in FIG. 1, in each row of sub-pixels, a B sub-pixel (i.e., a sub-pixel marked as B in FIG. 1), a G sub-pixel (i.e., a sub-pixel marked as G in FIG. 1), and an R sub-pixel (i.e., a sub-pixel marked as R in FIG. 1) constitute a group to repeatedly arranged. Moreover, two adjacent rows of sub-pixels are staggered, and a staggered width is, for example, half of a width of each sub-pixel in row direction X-X'. Therefore, each sub-pixel in a next row of sub-pixels is aligned with a gap between two adjacent sub-pixels in a current row corresponding thereto in column direction Y-Y'. In this way, three sub-pixels with different colors that are located in two adjacent rows and proximate to each other are arranged with a delta shape (as shown by the dotted box in FIG. 1).

It will be noted that, in FIG. 1, only a partial arrangement of a plurality of sub-pixels that are arranged in a matrix is illustrated, and the remaining sub-pixels not shown are also arranged according to the delta arrangement of R, G, and B sub-pixels.

The R, G, and B sub-pixels further include OLED devices capable of emitting red light, green light, and blue light, respectively. Each hexagon in FIG. 1 illustrates the light-emitting layer of each OLED device, i.e., the R light-emitting layer, the G light-emitting layer, or the B light-emitting layer. A covered component under each light-emitting layer is an anode O1 of each OLED device. A cathode of the OLED device is usually a transparent electrode, so that the light emitted by the light-emitting layer of the OLED device may exit from the transparent cathode above (i.e., top-emitting). The cathodes of the OLED devices are usually connected together as an entire layer. The cathode of each OLED device is not shown in FIG. 1.

For example, in an OLED device included in the G sub-pixel, as shown in FIG. 1, the anode O1 is one electrode to control the entire light-emitting layer in the G sub-pixel to emit light. Or, the anode O1 may also be divided into a plurality of electrodes (e.g., two electrodes) in the column direction Y-Y', so as to control the portion of the light-emitting layer in the G sub-pixel corresponding to each electrode to emit light. The above design is a conventional design and will not be described in detail.

With continued reference to FIG. 1, based on the design of the delta shape of R, G, and B sub-pixels, in the related art, the design manner of the photosensitive units is that a photosensitive unit is provided under a gap between two adjacent sub-pixels in the row direction X-X'. FIG. 1 only illustrates the photosensitive layer S in each photosensitive unit.

After the photosensitive units are added to the OLED display panel, since the gap between two adjacent sub-pixels is very small (in the row direction X-X', compared with the width of each sub-pixel, a width of the gap is very small, which may be approximately ignored). The photosensitive layer S needs a certain area to receive the light reflected by the ridges and valleys in the finger surface. Therefore, in the row direction X-X', in a case where the photosensitive layers S are disposed under the gap between two of the R, G, and B sub-pixels, an orthographic projection of the photosensitive layer on a panel surface of the OLED display panel and orthographic projections of the light-emitting layers of two adjacent sub-pixels corresponding thereto on the panel surface of the OLED display panel inevitably have an overlapping region therebetween. In this way, the light reflected by the ridges and valleys in the surface of the finger passes through the light-emitting layers of two of the R, G, and B sub-pixels and irradiates to the surface of the photosensitive layer disposed under the gap between two adjacent sub-pixels. The panel surface of the OLED display panel may be understood as a display surface of the OLED display panel on which image are displayed.

In the design manner, each photosensitive unit is disposed under different R light-emitting layer, G light-emitting layer, and B light-emitting layer. There are three arrangement positions of the photosensitive units. The photosensitive unit is located below a gap between the R sub-pixel and the G sub-pixel, or located below a gap between the G sub-pixel and the B sub-pixel, or located below a gap between the R sub-pixel and the B sub-pixel.

Herein, the first row of sub-pixels in FIG. 1 is taken as an example, the photosensitive layer S of the first photosensitive unit from the left is located below the gap between the B sub-pixel and the G sub-pixel, and the reflected light received by the photosensitive layer S is filtered by the B light-emitting layer and the G light-emitting layer. The photosensitive layer S of the second photosensitive unit from the left is located below the gap between the G sub-pixel and the R sub-pixel, and the reflected light received by the photosensitive layer S is filtered by the G light-emitting layer and the R light-emitting layer. The photosensitive layer S of the third photosensitive unit from the left is located below the gap between the R sub-pixel and the B sub-pixel, and the reflected light received by the photosensitive layer S is filtered by the R light-emitting layer and the B light-emitting layer.

Since materials of the light-emitting layers that emit light of different colors are different, accordingly, the light-emitting layers that emit light of different colors filter the light reflected by the ridges and valleys in the surface of the finger to different degrees. As a result, the degree to which the reflected light reaching the photosensitive layer of each photosensitive unit is filtered varies greatly, which causes photoelectric signals generated by the photosensitive unit to distort to a certain extent, and affects the accuracy of the fingerprint recognition.

Figure 2:
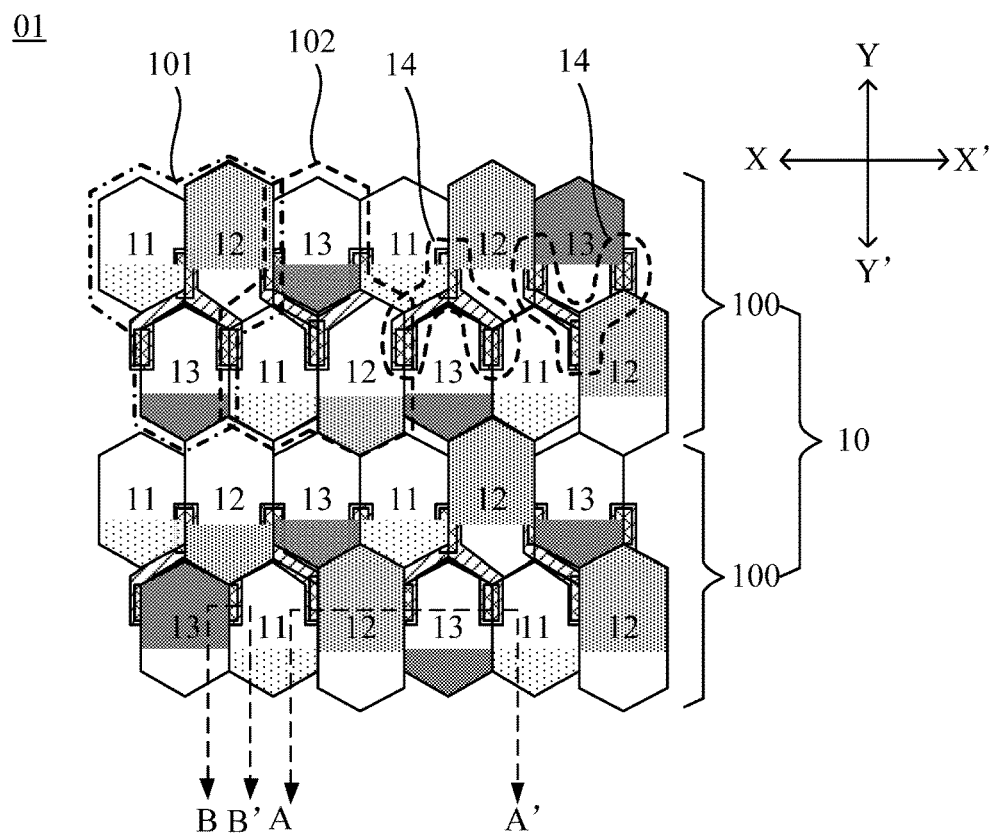
FIG. 2 is a top view of a display panel, according to some embodiments.

On this basis, in one aspect, the embodiments of the present disclosure provide a display panel. As shown in FIG. 2, the display panel 01 includes a sub-pixel array 10 and a plurality of photosensitive units 14 disposed under a light-emitting surface of the sub-pixel array 10. The light-emitting surface of the sub-pixel array 10 is a surface of the sub-pixel array 10 from which light emits. In a case where each sub-pixel in the sub-pixel array includes a light-emitting device, the light-emitting surface of the sub-pixel array 10 may also be understood as a surface of the light-emitting layer in the light-emitting device from which light emits.

The sub-pixel array 10 includes a first sub-pixel 11, a second sub-pixel 12 and a third sub-pixel 13 that are capable of emitting light of different colors. The plurality of photosensitive units 14 are disposed under gaps of the sub-pixel array 10. Each of the plurality of photosensitive units 14 includes a photosensitive device, and the photosensitive device includes a photosensitive layer. An orthographic projection of the photosensitive layer 1401 in each photosensitive device on the panel surface of the display panel 01 has overlapping regions with orthographic projections of the first sub-pixel 11, the second sub-pixel 12, and the third sub-pixel 13 on the panel surface of the display panel 01. The panel surface of the display panel refers to the display surface of the display panel.

In some embodiments, the display panel 01 is a fingerprint recognition display panel, which is a display panel in which the photosensitive units 14 used for fingerprint recognition are integrated in the OLED display panel.

It will be understood that the first sub-pixel 11, the second sub-pixel 12, and the third sub-pixel 13 are capable of emitting light of different colors, and the light of different colors may include, for example, blue light, green light, and red light.

For example, the first sub-pixel 11 is capable of emitting blue light, that is, the first sub-pixel 11 is a B sub-pixel. The second sub-pixel 12 is capable of emitting green light, that is, the second sub-pixel 12 is a G sub-pixel. The third sub-pixel 13 is capable of emitting red light, that is, the third sub-pixel 13 is an R sub-pixel.

In this way, in the display panel 01 provided by some embodiments of the present disclosure, and in each photosensitive unit 14 used for fingerprint recognition integrated in the display panel 01, the orthographic projection of the photosensitive layer 1401 in the photosensitive device on the panel surface of the display panel 01 has overlapping regions with orthographic projections of the first sub-pixel 11, the second sub-pixel 12, and the third sub-pixel 13 that are capable of emitting light of different colors on the panel surface of the display panel 01. That is, each photosensitive unit 14 is located under a light-emitting layer in the first sub-pixel 11, a light-emitting layer in the second sub-pixel 12, and a light-emitting layer in the third sub-pixel 13. The light reflected by the ridges and valleys in the surface of the finger received by the photosensitive layer 1401 in each photosensitive unit 14 is filtered light passing through the light-emitting layers in the sub-pixels capable of emitting light of three colors. In this way, a difference in degree to which the reflected light reaching the photosensitive layer 1401 in each photosensitive unit 14 is filtered is reduced, and a degree of distortion of the photoelectric signal generated by the photosensitive unit is reduced, which increases recognition accuracy of the photosensitive unit 14 integrated in the display panel 01.

In some embodiments, an area of an overlapping region between an orthographic projection of each photosensitive layer 1401 on the panel surface of the display panel 01 and orthographic projections of the first sub-pixels 11 on the panel surface of the display panel 01 is equal. An area of an overlapping region between an orthographic projection of each photosensitive layer 1401 on the panel surface of the display panel 01 and orthographic projections of the second sub-pixels 12 on the panel surface of the display panel 01 is equal. An area of an overlapping region between an orthographic projection of each photosensitive layer 1401 on the panel surface of the display panel 01 and an orthographic projection of the third sub-pixel 13 on the panel surface of the display panel 01 is equal.

It will be noted that, since the first sub-pixel 11, the second sub-pixel 12 and the third sub-pixel 13 are capable of emitting light of different colors, based on color configuration requirements, when the display panel 01 displays images, in some examples, patterns of the first sub-pixel 11, the second sub-pixel 12 and the third sub-pixel 13 are not necessarily the same in a direction perpendicular to the panel surface of the display panel 01. Therefore, an area of an overlapping region between each photosensitive layer 1401 and sub-pixel(s) emitting light of a same color is equal; the areas of the overlapping regions between each photosensitive layer 1401 and sub-pixels emitting light of different colors may be equal or not, which is not limited in the embodiments of the present disclosure.

In this way, in a case where the area of the overlapping region between the orthographic projection of each photosensitive layer 1401 on the panel surface of the display panel 01 and the orthographic projection(s) of the sub-pixel(s) emitting light of a same color on the panel surface of the display panel 01 is equal, a total area of a region of the photosensitive layer 1401 in each photosensitive unit 14 which is blocked by the light-emitting layers of the first sub-pixel 11, the second sub-pixel 12 and the third sub-pixel 13 that are capable of emitting light of different colors is the same, and the difference in the degree to which the reflected light received by the photosensitive layer 1401 in each photosensitive unit 14 is filtered is eliminated. In this way, a problem of photoelectric signal distortion caused by the difference in the degree of filtering may be solved, and the recognition accuracy of the photosensitive units 14 integrated in the display panel 01 may be further improved.

In some embodiments, in the display panel 01 provided by some embodiments of the present disclosure, the arrangement manner of the sub-pixels is specifically in a delta shape. With continued reference to FIG. 2, the sub-pixel array 10 specifically includes a plurality of display groups 100 arranged in sequence in the column direction Y-Y'.

Each of the plurality of display groups 100 includes: first display sub-groups 101 and second display sub-groups 102 that are alternately arranged in sequence in the row direction X-X'.

Each first display sub-group 101 and each second display sub-group 102 each include: a first sub-pixel 11, a second sub-pixel 12 and a third sub-pixel 13 distributed in two adjacent rows.

In each display group 100, the first sub-pixel 11 and the second sub-pixel 12 in each first display sub-group 101 is located in a same row as the third sub-pixel 13 in each second display sub-group 102, and the third sub-pixel 13 in each first display sub-group 101 is located in a same row as the first sub-pixel 11 and the second sub-pixel 12 in each second display sub-group 102.

That is, in each display group 100, each first display sub-group 101 presents an inverted delta-shaped structure (hereinafter referred to as an inverted delta shape), and each second display sub-group 102 presents a normal delta-shaped structure (hereinafter referred to as a normal delta shape).

In this way, in the row direction X-X', the sub-pixel array 10 includes a column of inverted delta-shaped display sub-groups and a column of normal delta-shaped display sub-groups that are alternately arranged.

Based on the design manner of arranging the display sub-groups having the inverted delta shape and the display sub-groups having the normal delta shape alternatively, some embodiments of the present disclosure further provide a photosensitive unit 14 having a structure similar to the letter Y (hereinafter referred to as Y-shaped), so that the Y-shaped photosensitive units 14 may be evenly distributed under the light-emitting surface of the sub-pixel array 10. With continued reference to FIG. 2, under the light-emitting surface of each first display sub-group 101 and the light-emitting surface of each second display sub-group 102, each of which is provided with a photosensitive unit 14.

Figure 3:
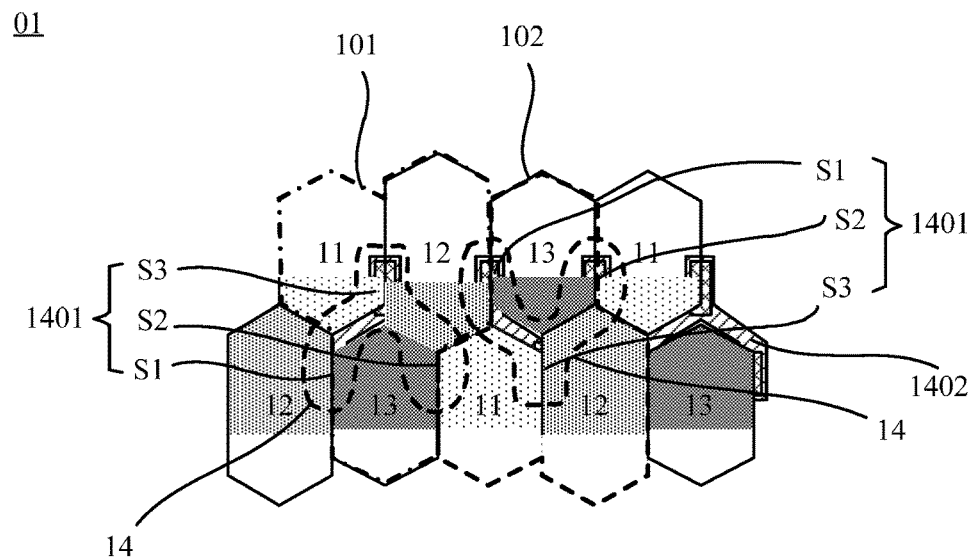
FIG. 3 is an enlarged view of a first display sub-group, a second display sub-group and corresponding photosensitive units in the display panel in FIG. 2.

As shown in FIG. 3, each photosensitive layer 1401 includes a first sub-photosensitive layer S1, a second sub-photosensitive layer S2, and a third sub-photosensitive layer S3.

In the direction perpendicular to the panel surface of the display panel 01, in a photosensitive unit 14 corresponding to each first display sub-group 101, the first sub-photosensitive layer S1 overlaps with the third sub-pixel 13 in the first display sub-group 101 and a second sub-pixel 12 in a neighbouring second display sub-group 102. The second sub-photosensitive layer S2 overlaps with the third sub-pixel 13 in the first display sub-group 101 and a first sub-pixel 11 in another neighbouring second display sub-group 102. The third sub-photosensitive layer S3 overlaps with the first sub-pixel 11 and the second sub-pixel 12 in the first display sub-group 101.

In the direction perpendicular to the panel surface of the display panel 01, in the photosensitive unit 14 corresponding to each second display sub-group 102, the first sub-photosensitive layer S1 overlaps with the third sub-pixel 13 in the second display sub-group 102 and a second sub-pixel 12 in a neighbouring first display sub-group 101. The second sub-photosensitive layer S2 overlaps with the third sub-pixel 13 in the second display sub-group 102 and a first sub-pixel 11 in another neighbouring first display sub-group 101. The third sub-photosensitive layer S3 overlaps with the first sub-pixel 11 and the second sub-pixel 12 in the second display sub-group 102.

Herein, "A overlaps with B" means that there is an overlapping region between an orthographic projection of A on the panel surface of the display panel 01 and an orthographic projection of B on the panel surface of the display panel 01.

In some examples, the first display sub-group 101 presents an inverted delta-shaped structure, and a photosensitive unit 14 corresponding to the first display sub-group 101 and located under the light-emitting surface of the first display sub-group 101 presents an inverted Y-shaped structure. In this way, branches of the photosensitive layer 1401 in each photosensitive unit 14 extending in three directions are located under gaps each of which is between different adjacent sub-pixels.

That is, the first sub-photosensitive layer S1 overlaps with the second sub-pixel 12 and the third sub-pixel 13, the second sub-photosensitive layer S2 overlaps with the first sub-pixel 11 and the third sub-pixel 13, and the third sub-photosensitive layer S3 overlaps with the first sub-pixel 11 and the second sub-pixel 12.

In this way, in a sub-pixel design with the delta shape, maximization of a light-receiving area of the photosensitive unit 14 under the light-emitting surface of each first display sub-group 101 having the inverted delta-shaped structure is achieved, so that signal strength of the photoelectric signal generated by the photosensitive unit 14 may be increased.

In some other examples, the second display sub-group 102 presents a normal delta-shaped structure, and a photosensitive unit 14 corresponding to the second display sub-group 102 and located under the light-emitting surface of the second display sub-group 102 presents a normal Y-shaped structure. In this way, the branches of the photosensitive layer 1401 in each photosensitive unit 14 extending in three directions are located under gaps each of which is between different adjacent sub-pixels.

That is, the first sub-photosensitive layer S1 overlaps with the second sub-pixel 12 and the third sub-pixel 13, the second sub-photosensitive layer S2 overlaps with the first sub-pixel 11 and the third sub-pixel 13, and the third sub-photosensitive layer S3 overlaps with the first sub-pixel 11 and the second sub-pixel 12.

In this way, in the sub-pixel design with the delta shape, maximization of a light-receiving area of the photosensitive unit 14 under the light-emitting surface of each second display sub-group 102 having the normal delta-shaped structure is achieved, so that the signal strength of the photoelectric signal generated by the photosensitive unit 14 may be increased.

In some embodiments, in order to enable more photosensitive units 14 to be integrated into the display panel 01, which is beneficial to achieve a full-screen fingerprint recognition, a photosensitive unit 14 is disposed between two adjacent first display sub-groups 101 in the column direction Y-Y' and a photosensitive unit 14 is disposed between two adjacent second display sub-groups 102 in the column direction Y-Y'. The arrangement manner is described in detail as follows.

Figure 4:
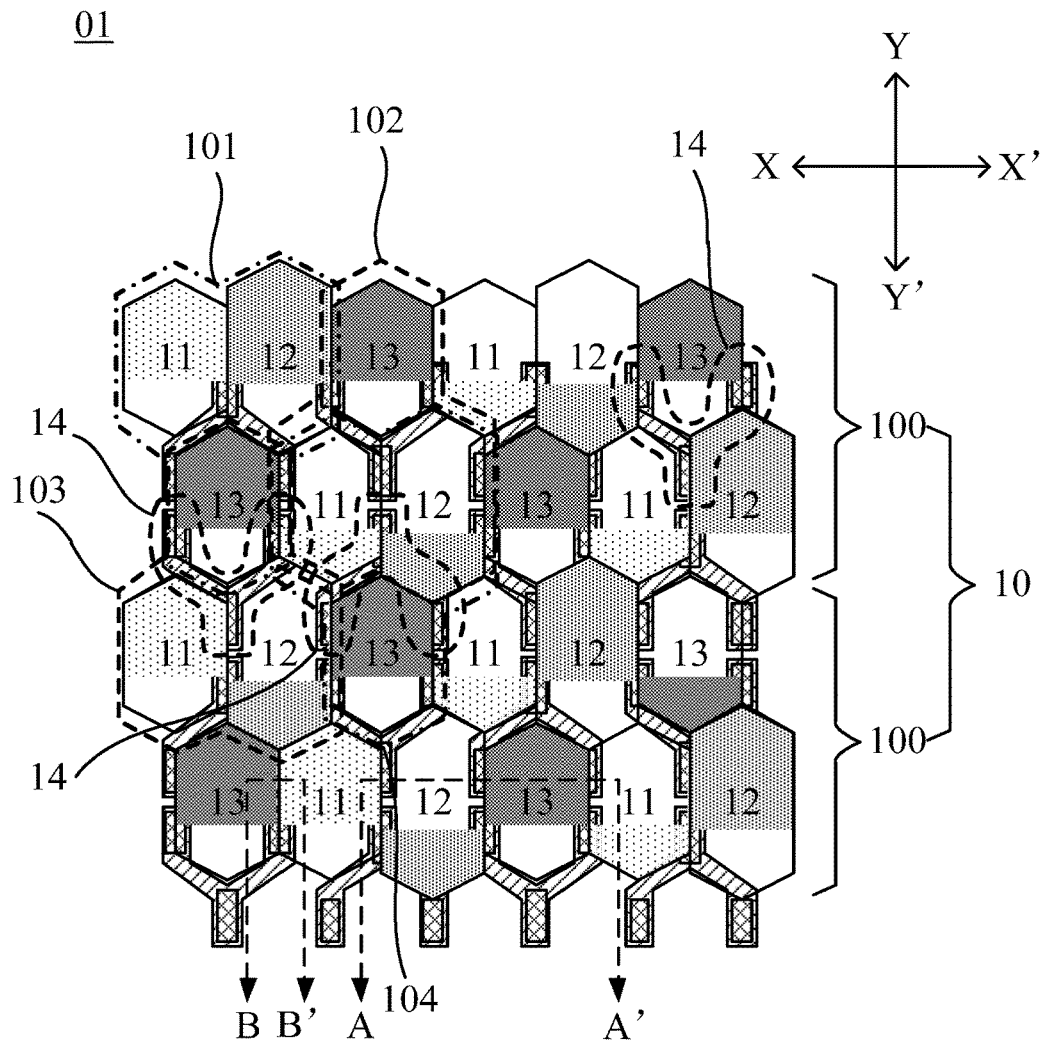
FIG. 4 is a top view of another display panel, according to some embodiments.

As shown in FIG. 4, in the column direction Y-Y', the third sub-pixel 13 in each first display sub-group 101 and the first sub-pixel 11 and the second sub-pixel 12 in another adjacent first display sub-group 101 constitute a first virtual sub-group 103. The first sub-pixel 11 and the second sub-pixel 12 in each second display sub-group 102 and the third sub-pixel 13 in another adjacent second display sub-group 102 constitute a second virtual sub-group 104. A photosensitive unit 14 is disposed under the light-emitting surface of each first virtual sub-group 103 and a photosensitive unit 14 is disposed under the light-emitting surface of each second virtual sub-group 104.

Figure 5:
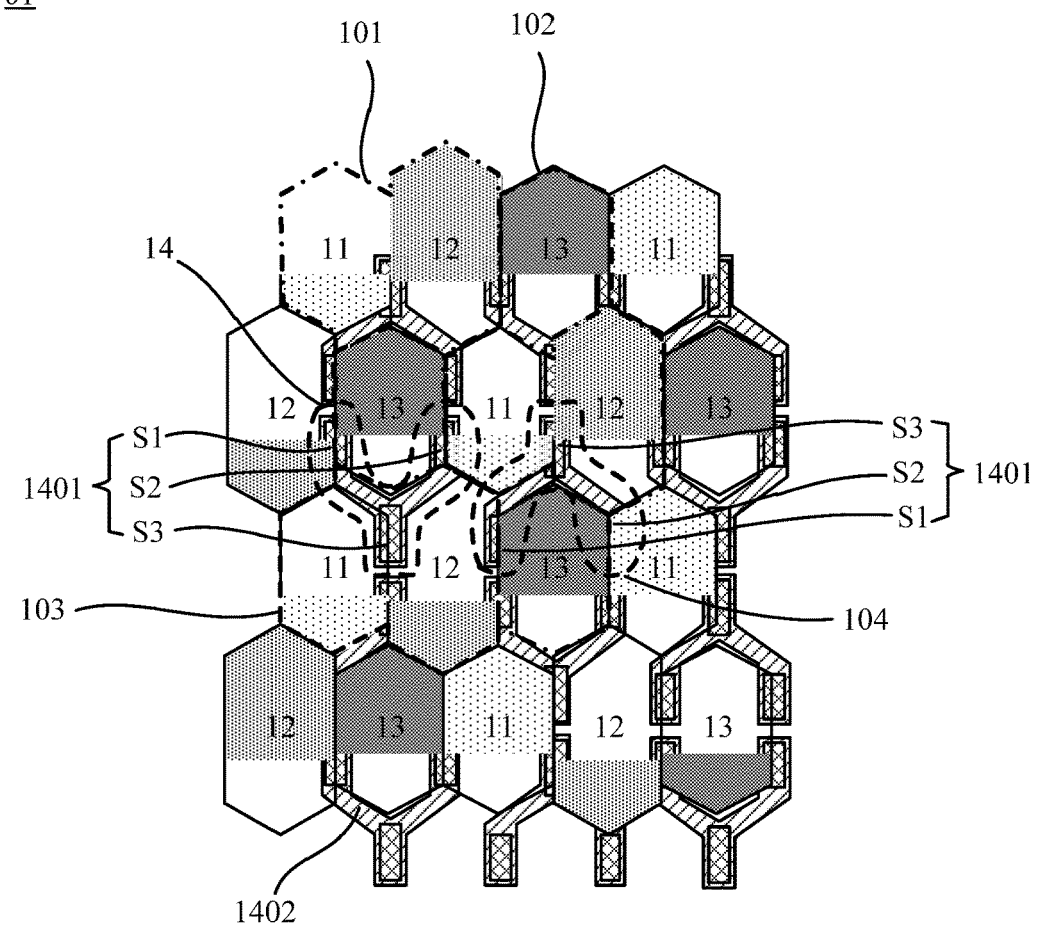
FIG. 5 is an enlarged view of a first virtual sub-group, a second virtual sub-group and corresponding photosensitive units in the display panel in FIG. 4.

As shown in FIG. 5, in the direction perpendicular to the panel surface of the display panel 01, in a photosensitive unit 14 corresponding to each first virtual sub-group 103, the first sub-photosensitive layer S1 overlaps with the third sub-pixel 13 in the first virtual sub-group 103 and a second sub-pixel 12 in a neighbouring second virtual sub-group 104. The second sub-photosensitive layer S2 overlaps with the third sub-pixel 13 in the first virtual sub-group 103 and a first sub-pixel 11 in another neighbouring second virtual sub-group 104. The third sub-photosensitive layer S3 overlaps with the first sub-pixel 11 and the second sub-pixel 12 in the first virtual sub-group 103.

It will be understood that, since the first display sub-group 101 presents an inverted delta-shaped structure, in two adjacent first display sub-groups 101 in the column direction Y-Y', the first virtual sub-group 103 composed of three sub-pixels that are proximate to each other presents a normal delta-shaped structure opposite to the inverted delta-shaped structure. The photosensitive unit 14 located under the light-emitting surface of the first virtual sub-group 103 with the normal delta-shaped structure has a normal Y-shaped structure correspondingly.

In this way, in the sub-pixel design with the delta shape, maximization of a light-receiving area of the photosensitive unit 14 under the light-emitting surface of each first virtual sub-group 103 having the normal delta-shaped structure may be achieved, so that the signal strength of the photoelectric signal generated by the photosensitive unit 14 may be increased.

With continued reference to FIG. 5, in the direction perpendicular to the panel surface of the display panel 01, in a photosensitive unit 14 corresponding to each second virtual sub-group 104, the first sub-photosensitive layer S1 overlaps with the third sub-pixel 13 in the second virtual sub-group 104 and a second sub-pixel 12 in a neighbouring first virtual sub-group 103. The second sub-photosensitive layer S2 overlaps with the third sub-pixel 13 in the second virtual sub-group 104 and a first sub-pixel 11 in another neighbouring first virtual sub-group 103. The third sub-photosensitive layer S3 overlaps with the first sub-pixel 11 and the second sub-pixel 12 in the second virtual sub-group 104.

It will be understood that, since the second display sub-group 102 presents a normal delta-shaped structure, in two adjacent second display sub-groups 102 in the column direction Y-Y', the second virtual sub-group 104 composed of three sub-pixels that are proximate to each other presents an inverted delta-shaped structure opposite to the normal delta-shaped structure. The photosensitive unit 14 located under the light-emitting surface of the second virtual sub-group 104 with the inverted delta-shaped structure has an inverted Y-shaped structure correspondingly.

In this way, in the sub-pixel design with the delta shape, maximization of a light-receiving area of the photosensitive unit 14 under the light-emitting surface of each second virtual sub-group 104 having the inverted delta-shaped structure may be achieved, so that the signal strength of the photoelectric signal generated by the photosensitive unit 14 may be increased.

In some embodiments, as shown in FIG. 3 or FIG. 5, in the normal Y-shaped photosensitive unit 14 and the inverted Y-shaped photosensitive unit 14, three branches in each photosensitive layer 1401 (i.e., the first sub-photosensitive layer S1, the second sub-photosensitive layer S2, and the third sub-photosensitive layer S3 included in the photosensitive layer 1401) are not connected to each other.

In this way, it is possible to evade some conventional structures such as lines and through holes that may be provided at gaps between adjacent sub-pixels, and leave space for arranging these structures.

In some embodiments, the photosensitive device in the photosensitive unit 14 further includes: a bottom electrode and a top electrode disposed on both sides of the photosensitive layer 1401 in the direction perpendicular to the panel surface of the display panel 01.

Orthographic projections of the first sub-photosensitive layer S1, the second sub-photosensitive layer S2 and the third sub-photosensitive layer S3 on the panel surface of the display panel 01 are within a range of an orthographic projection of the bottom electrode on the panel surface of the display panel 01. Portions of the bottom electrode corresponding to the first sub-photosensitive layer S1, the second sub-photosensitive layer S2 and the third sub-photosensitive layer S3 are connected to each other. The portions of the bottom electrode corresponding to the first sub-photosensitive layer S1, the second sub-photosensitive layer S2 and the third sub-photosensitive layer S3 are portions of the bottom electrode, the orthographic projections of which on the panel surface of the display panel 01 overlap with the orthographic projections of the first sub-photosensitive layer S1, the second sub-photosensitive layer S2 and the third sub-photosensitive layer S3 on the panel surface of the display panel 01. That is, each bottom electrode has an integrated structure.

The orthographic projections of the first sub-photosensitive layer S1, the second sub-photosensitive layer S2 and the third sub-photosensitive layer S3 on the panel surface of the display panel 01 are within a range of an orthographic projection of the top electrode on the panel surface of the display panel 01. Portions of the top electrode corresponding to the first sub-photosensitive layer S1, the second sub-photosensitive layer S2, and the third sub-photosensitive layer S3 are connected to each other. The portions of the top electrode corresponding to the first sub-photosensitive layer S1, the second sub-photosensitive layer S2, and the third sub-photosensitive layer S3 are portions of the top electrode, the orthographic projections of which on the panel surface of the display panel 01 overlap with the orthographic projections of the first sub-photosensitive layer S1, the second sub-photosensitive layer S2 and the third sub-photosensitive layer S3 on the panel surface of the display panel 01. That is, each top electrode has an integrated structure.

Through the above arrangement, the first sub-photosensitive layer S1, the second sub-photosensitive layer S2, and the third sub-photosensitive layer S3 that are not connected to each other can all be disposed on the surface of the bottom electrode. The top electrode can cover the first sub-photosensitive layer S1, the second sub-photosensitive layer S2, and the third sub-photosensitive layer S3 that are not connected to each other. Therefore, a photosensitive unit 14 is formed.

In some examples, referring to FIGS. 3 and 5, the bottom electrode 1402 in the photosensitive unit 14 having the normal Y-shaped structure or the inverted Y-shaped structure has a normal Y-shaped structure or an inverted Y-shaped structure correspondingly, and the top electrode is generally a transparent electrode, which is not shown in FIG. 3 or FIG. 5.

As a possible implementation, for convenience of manufacturing and designing sub-photosensitive layers in the photosensitive layer 1401 extending in three directions, with continued reference to FIGS. 2 to 5, an area of an overlapping region between each first sub-photosensitive layers S1 and a corresponding second sub-pixel 12 is equal, and an area of an overlapping region between each first sub-photosensitive layer S1 and a corresponding third sub-pixel 13 is equal. An area of an overlapping region between each second sub-photosensitive layer S2 and a corresponding first sub-pixel 11 is equal, and an area of an overlapping region between each second sub-photosensitive layer S2 and a corresponding third sub-pixel 13 is equal. An area of an overlapping region between each third sub-photosensitive layer S3 and a corresponding first sub-pixel 11 is equal, and an area of an overlapping region between each third sub-photosensitive layer S3 and a corresponding second sub-pixel 12 is equal.

Herein, "an overlapping region between A and B" refers to an overlapping region between an orthographic projection of A on the panel surface of the display panel 01 and an orthographic projection of B on the panel surface of the display panel 01.

In an example where the first sub-pixel 11, the second sub-pixel 12 and the third sub-pixel 13 are a B sub-pixel, a G sub-pixel and an R sub-pixel respectively, under the light-emitting surfaces of different sub-pixels, the area distribution ratios of regions of each photosensitive unit 14 covered by the light-emitting layers in the corresponding sub-pixels are shown in Table 1 below. As can be seen from Table 1, an area of the region of the photosensitive unit 14 with the normal Y-shaped structure covered by the light-emitting layers of the R, G, and B sub-pixels is correspondingly equal to an area of the region of the photosensitive unit 14 with the inverted Y-shaped structure covered by the light-emitting layers of the R, G, and B sub-pixels. In this way, the difference in degree to which the reflected light received by the photosensitive layer 1401 in each photosensitive unit is filtered may be eliminated, and the problem of the photoelectric signal distortion due to the difference in filtering degree may be solved.

TABLE 1

The area distribution ratios of regions of each photosensitive unit covered by light-emitting layers of different sub-pixels

| Photo-sensitive unit | Third sub-pixel (R) | Second sub-pixel (G) | First sub-pixel (B) |
|---|---|---|---|
| Normal Y-shaped structure | 28% | 36% | 36% |

TABLE 1-continued

The area distribution ratios of regions of each photosensitive unit covered by light-emitting layers of different sub-pixels

| Photo-sensitive unit | Third sub-pixel (R) | Second sub-pixel (G) | First sub-pixel (B) |
|---|---|---|---|
| Inverted Y-shaped structure | 28% | 36% | 36% |

With continued reference to FIG. 1, in the related art, the sub-pixel is generally designed as a hexagon, and a length of the hexagon in the column direction Y-Y' is greater than its width in the row direction X-X'. That is, the shape of each sub-pixel is a hexagon with a long strip shape.

In this way, in a case where a photosensitive unit is provided under a gap between two adjacent sub-pixels, a distance W1 between photosensitive layers S in two adjacent photosensitive units in the row direction X-X' is not equal to a distance W2 between photosensitive layers S in two adjacent photosensitive units in the column direction Y-Y'. Therefore, the distance between the photosensitive units in the row direction and the distance between the photosensitive units in the column direction are different. In this case, an image distortion may occur when fingerprint is collected, resulting in the generated fingerprint image being compressed or stretched, and there is a need to add a correction algorithm, which increases the difficulty of fingerprint recognition.

Based on the above-mentioned problems, some embodiments of the present disclosure further provide a structure that distances between the photosensitive units with the Y-shaped structure in both the row direction and the column direction are the same. In this way, image distortion may not occur when fingerprint is collected, and there is no need to add a correction algorithm, which reduces the difficulty of fingerprint recognition.

With continued reference to FIG. 4, in a column of the first display sub-group 101, a gap between the first sub-pixel 11 and the second sub-pixel 12 is aligned with a center line of the third sub-pixel 13 in the column direction Y-Y'. In a column of the second display sub-group 102, a gap between the first sub-pixel 11 and the second sub-pixel 12 is aligned with a center line of the third sub-pixel 13 in the column direction Y-Y'.

In this way, the photosensitive units 14 located under the light-emitting surfaces of each first display sub-group 101, each second display sub-group 102, each first virtual sub-group 103, and each second virtual sub-group 104 form a photosensitive unit array arranged in a matrix.

Figure 6:
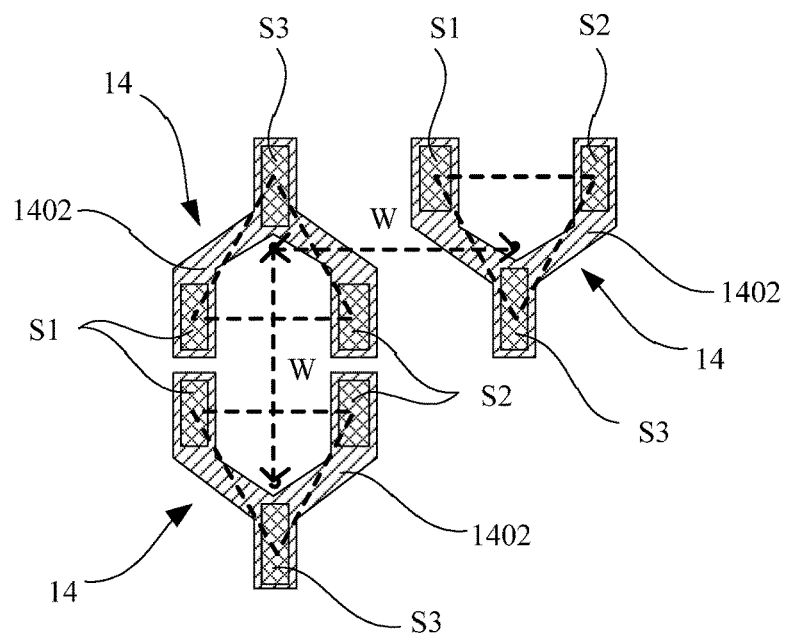
FIG. 6 is a diagram showing distances of a photosensitive unit array in the display panel in FIG. 4 in a row direction and a column direction.

In some embodiments, in order to make the photosensitive units 14 in the photosensitive unit array have a same distance in both the row direction X-X' and the column direction Y-Y', as shown in FIG. 6, centers of the first sub-photosensitive layer S1, the second sub-photosensitive layer S2 and the third sub-photosensitive layer S3 in each photosensitive unit 14 are connected to form a virtual triangle (as shown by the dotted triangle in FIG. 6). In the row direction X-X' and the column direction Y-Y', a distance between middle points of two adjacent virtual triangles is equal (that is, the distance is W).

Herein, the middle point in each virtual triangle is a middle point of a vertical line from the vertex corner where the center of the third sub-photosensitive layer is located to the opposite side.

In some examples, with continued reference to FIGS. 2 to 5, in the direction perpendicular to the panel surface of the display panel 01, shapes of the first sub-pixel 11, the second sub-pixel 12, and the third sub-pixel 13 are all hexagons.

Figure 7:
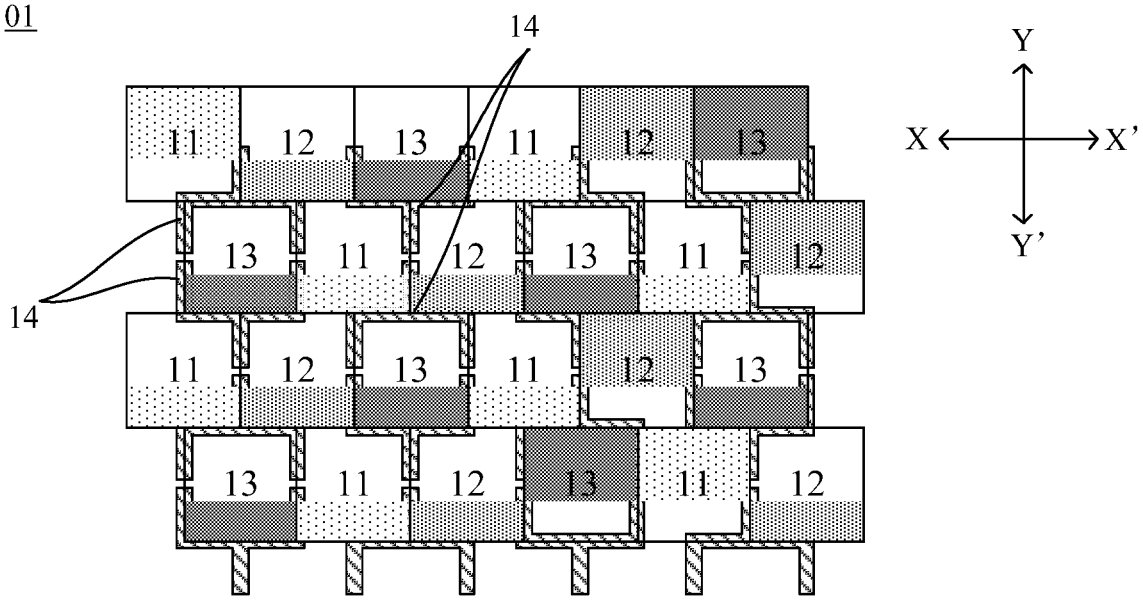
FIG. 7 is a top view of yet another display panel, according to some embodiments.
Figure 8:
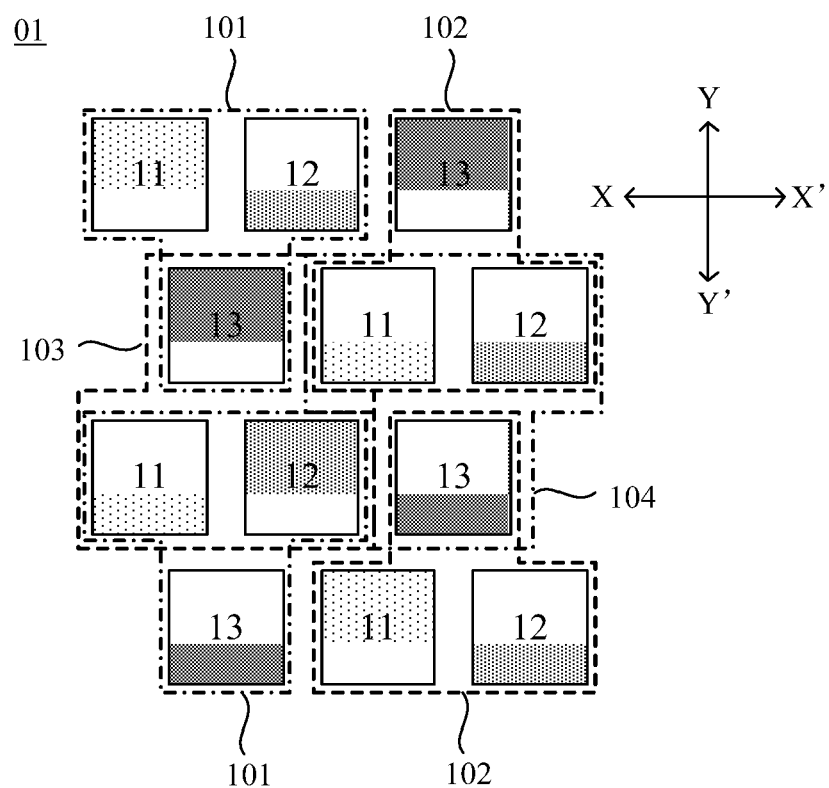
FIG. 8 is an enlarged view of display sub-groups and virtual sub-groups in the display panel in FIG. 7.

In some other examples, referring to FIGS. 7 and 8, in the direction perpendicular to the panel surface of the display panel 01, the shapes of the first sub-pixel 11, the second sub-pixel 12 and the third sub-pixel 13 are all rectangles. The present disclosure does not limit the shapes of the first sub-pixel 11, the second sub-pixel 12 and the third sub-pixel 13.

As shown in FIGS. 7 and 8, a photosensitive unit 14 with the inverted Y-shaped structure is disposed under the light-emitting surface of each first display sub-group 101 with the inverted delta-shaped structure. A photosensitive unit 14 with the normal Y-shaped structure is disposed under the light-emitting surface of each second display sub-group 102 with the normal delta-shaped structure. A photosensitive unit 14 with the normal Y-shaped structure is disposed under the light-emitting surface of each first virtual sub-group 103 with the normal delta-shaped structure. A photosensitive unit 14 with the inverted Y-shaped structure is disposed under the light-emitting surface of each second virtual sub-group 104 with the inverted delta-shaped structure.

It will be noted that, in FIG. 7, only an overall structure of each photosensitive unit 14 is illustrated, and the first sub-photosensitive layer S1, the second sub-photosensitive layer S2, and the third sub-photosensitive layer S3 that are not connected to each other are not illustrated. The shapes and specific descriptions of the sub-photosensitive layers may be referred to the specific description of FIGS. 2 to 5 and the corresponding embodiments above, and details will not be repeated here.

In addition, FIG. 8 is the enlarged schematic diagram, which is only used for illustrating the arrangement manner of the rectangular sub-pixels, and does not illustrate the photosensitive units under the light-emitting surfaces of the display sub-groups and the light-emitting surfaces of the virtual sub-groups.

Figure 9:
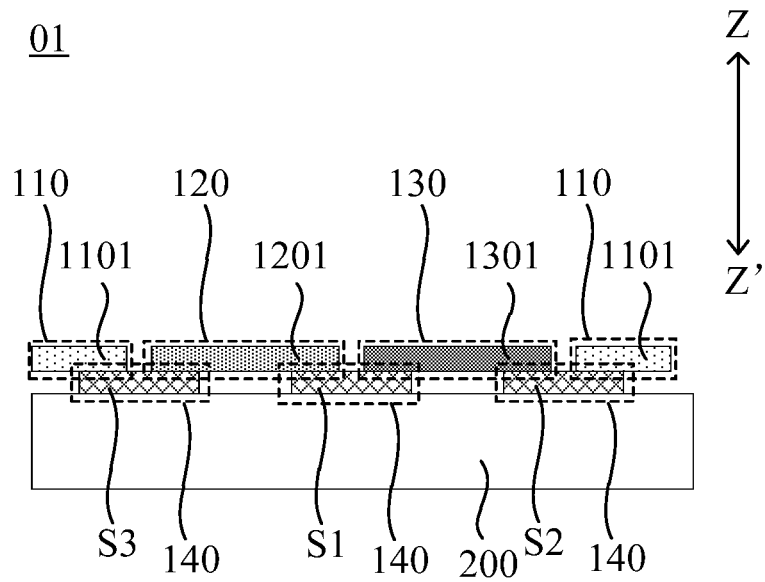
FIG. 9 is a section along direction A-A' in FIGS. 2 and 4.

In some embodiments, as shown in FIG. 9, the first sub-pixel includes a first light-emitting device 110. The second sub-pixel includes a second light-emitting device 120. The third sub-pixel includes a third light-emitting device 130.

It will be understood that the display panel 01 further includes a base substrate 200, and the sub-pixels and the photosensitive units 14 are disposed on the base substrate 200.

With continued reference to FIG. 9, in a direction Z-Z' perpendicular to the panel surface of the display panel 01, a portion of the first sub-pixel overlapping with the photosensitive layer in the photosensitive unit (in the cross-sectional direction in FIG. 9, specifically, the second sub-photosensitive layer S2 and the third sub-photosensitive layer S3 are shown) is specifically a light-emitting layer 1101 of the first light-emitting device 110 in the first sub-pixel. A portion of the second sub-pixel overlapping with the photosensitive layer (in the cross-sectional direction in FIG. 9, specifically, the first sub-photosensitive layer S1 and the third sub-photosensitive layer S3 are shown) is specifically a light-emitting layer 1201 of the second light-emitting device 120 in the second sub-pixel. A portion of the third sub-pixel overlapping with the photosensitive layer (in the cross-sectional direction in FIG. 9, specifically, the first sub-photosensitive layer S1 and the second sub-photosensitive layer S2 are shown) is specifically a light-emitting layer 1301 of the third light-emitting device 130 in the third sub-pixel.

Herein, "A overlapping with B" means that there is an overlapping region between an orthographic projection of A on the panel surface of the display panel 01 and an orthographic projection of B on the panel surface of the display panel 01.

Furthermore, each first sub-pixel 11, each second sub-pixel 12 and each third sub-pixel 13 further includes: a driving transistor D electrically connected to the corresponding light-emitting device in the sub-pixel.

Each photosensitive unit 14 further includes: a switching transistor T electrically connected to the photosensitive device 140 in the photosensitive unit 14.

A material of an active layer in the driving transistor D in each sub-pixel is different from a material of an active layer in the switching transistor T in the photosensitive unit. The active layer in the switching transistor T is made of an oxide semiconductor material.

It will be understood that "each first sub-pixel 11, each second sub-pixel 12 and each third sub-pixel 13 further includes a driving transistor D electrically connected to the corresponding light-emitting device in the sub-pixel" means that each first sub-pixel 11 further includes a driving transistor D electrically connected to the first light-emitting device 110 to receive a corresponding driving signal, each second sub-pixel 12 further includes a driving transistor D electrically connected to the second light-emitting device 120 to receive a corresponding driving signal, and each third sub-pixel 13 further includes a driving transistor D electrically connected to the third light-emitting device 130 to receive a corresponding driving signal.

In the above embodiments, the active layer of the switching transistor T in the photosensitive unit 14 is made of the oxide semiconductor material. Compared with the active layer manufactured by using the low temperature polysilicon (LTPS) material, the leakage current of the switching transistor T may be reduced. Therefore, an influence of a large leakage current on the visibility of the difference between the fingerprint ridge signal and the fingerprint valley signal generated by the photosensitive device 140 is reduced, and the difference between the fingerprint ridge signal and the fingerprint valley signal generated by the photosensitive device 140 is increased. Furthermore, the accuracy of fingerprint recognition is improved. By combining with the arrangement manner of the Y-shaped photosensitive units 14 described above, it is advantageous to integrate photosensitive units with excellent fingerprint recognition accuracy into the display panel 01.

In some examples, the oxide semiconductor material includes at least one of the indium gallium zinc oxide (IGZO), the indium gallium tin oxide (IGTO) and the indium zinc tin oxide (IZTO).

In some embodiments, the active layer of the driving transistor D in each sub-pixel may be made of a conventional material such as monocrystalline silicon, polycrystalline silicon, low temperature polycrystalline silicon, or organic semiconductor. For example, the active layer of the driving transistor D in each sub-pixel may be made of conventional low temperature polysilicon (LTPS) to simplify the manufacturing process, and a low temperature polycrystalline-oxide (LTPO) hybrid process achieving an oxide process for optical fingerprint devices and an LTPS process for sub-pixels used to display is realized.

Specific structures of an OLED display panel without integrating photosensitive units and an OLED display panel integrated with photosensitive units in the related art will be illustrated below.

Figure 10:
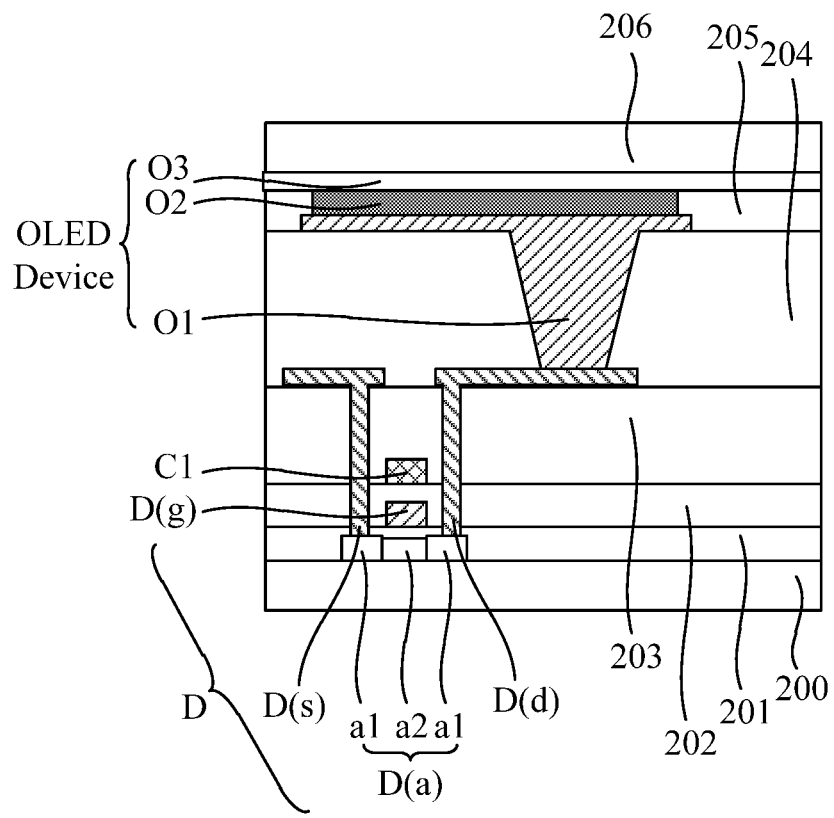
FIG. 10 is a section of an OLED display panel, according to some embodiments.

As shown in FIG. 10, in a conventional OLED display panel without integrating photosensitive units, the active layer in the driving transistor D in each sub-pixel is generally made of the LTPS material, and a typical manufacturing process thereof requires eight patterning processes (hereinafter referred to as an eight mask process). The specific structure of the display panel is as follows.

With continued reference to FIG. 10, the OLED display panel includes the following structures sequentially arranged on the base substrate 200:

an active layer D(a), and the active layer D(a) includes: two doped regions a1 for in contact with a source D(s) and a drain D(d) that are subsequently formed, and an undoped region a2 located between the two doped regions a1;

a gate insulating layer (also known as a gate insulator, short for GI) 201 covering the active layer D(a);

a gate D(g) disposed on the gate insulating layer 201;

a first interlayer insulating layer (also known as inter layer dielectric, short for ILD) 202 covering the gate D(g);

a storage capacitor electrode C1 disposed on the first interlayer insulating layer 202 and opposite to the gate D(g), so that the storage capacitor electrode C1 and the gate D(g) form a storage capacitor;

a second interlayer insulating layer 203 covering the storage capacitor electrode C1;

a source D(s) and a drain D(d) disposed on the second interlayer insulating layer 203 and connected to the two doped regions a1 through different via holes each passing through the second interlayer insulating layer 203, the first interlayer insulating layer 202 and the gate insulating layer 201, and the gate D(g), the source D(s), the drain D(d) and the active layer D(a) constitute the driving transistor D;

a third interlayer insulating layer 204 covering the driving transistor D;

an anode O1 disposed on the third interlayer insulating layer 204, and the anode 01 is connected to the drain D(d) below through a via hole in the third interlayer insulating layer 204;

a pixel defining layer (short for PDL) 205 covering the anode O1, an opening portion formed in the pixel defining layer 205 exposes the anode O1, so that the light-emitting layer O2 is deposited at least in the opening portion and connected to the anode O1;

a cathode O3 covering the light-emitting layer O2 and the pixel defining layer 205, so that the cathode O3, the anode O1 and the light-emitting layer O2 located between the two constitute an OLED device; and a thin film encapsulation (short for TFE) layer 206 covering the OLED device.

Figure 11:
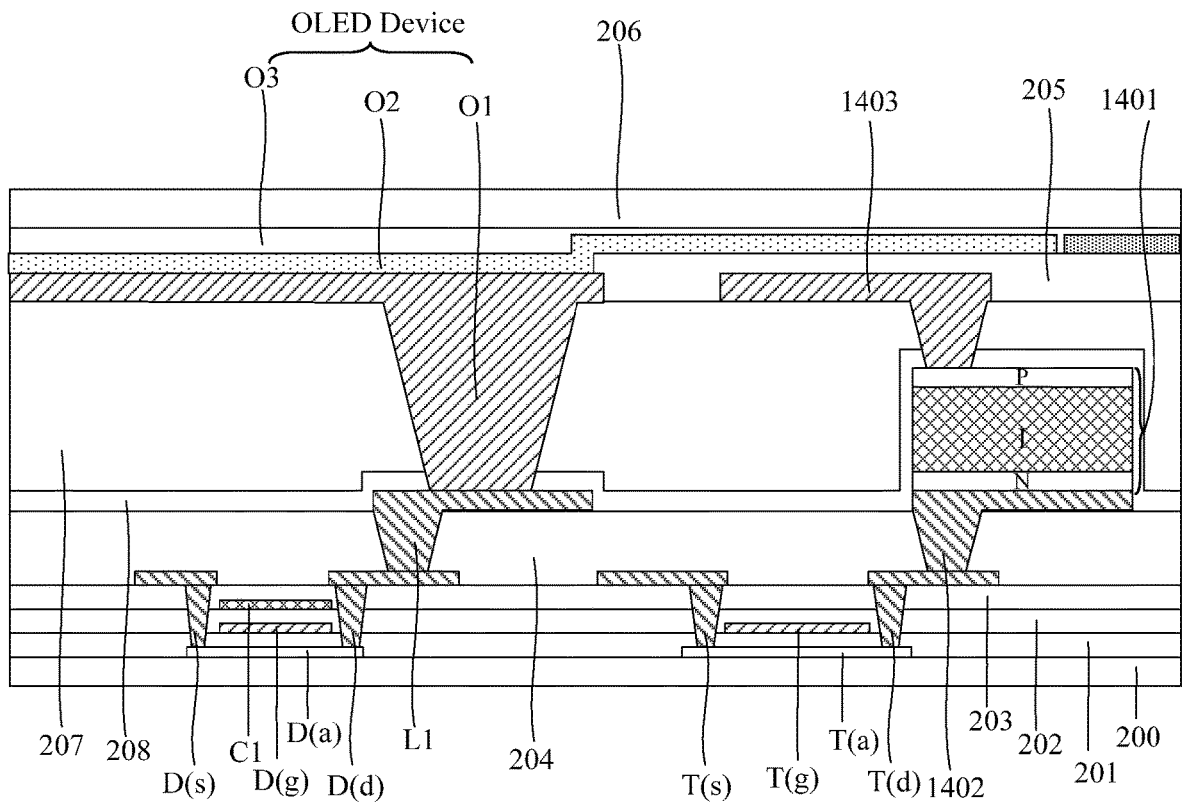
FIG. 11 is a section along direction B-B' in FIG. 1.

Furthermore, a sectional structure of the conventional OLED display panel integrated with photosensitive units is as shown in FIG. 11, based on the eight mask process illustrated in FIG. 10, since the switching transistor T and the photosensitive device in the photosensitive unit are added, a 12 mask process is required, and details are as follows.

With continued reference to FIG. 11, in a direction away from the base substrate 200, structures of layers disposed on the base substrate 200 are as follows:

an active layer D(a) of the driving transistor D in each sub-pixel and an active layer T(a) of the switching transistor T in each photosensitive unit;

a gate insulating layer 201 covering the above structures;

a gate D(g) of the driving transistor D in each sub-pixel and a gate T(g) of the switching transistor T in each photosensitive unit that are disposed on the gate insulating layer 201;

a first interlayer insulating layer 202 covering the above structures;

a storage capacitor electrode C1 disposed on the first interlayer insulating layer 202 and opposite to the gate D(g), so that the storage capacitor electrode C1 and the gate D(g) form the storage capacitor;

a second interlayer insulating layer 203 covering the above structures;

a source D(s) and a drain D(d) disposed on the second interlayer insulating layer 203 and connected to the active layer D(a) through different via holes each passing through the second interlayer insulating layer 203, the first interlayer insulating layer 202 and the gate insulating layer 201, and the gate D(g), the source D(s), the drain D(d) and the active layer D(a) constitute the driving transistor D; the source T(s) and the drain T(d) disposed on the second interlayer insulating layer 203 and connected to the active layer T(a) through different via holes each passing through the second interlayer insulating layer 203, the first interlayer insulating layer 202 and the gate insulating layer 201, and the gate T(g), the source T(s), the drain T(d) and the active layer T(a) constitute the switching transistor T;

a third interlayer insulating layer 204 covering the above structures;

a connection portion L1 and a bottom electrode 1402 of the photosensitive device disposed on the third interlayer insulating layer 204 and respectively connected to the drain D(d) of the driving transistor D and the drain T(d) of the switching transistor T through different via holes each passing through the third interlayer insulating layer 204; herein, the added connection portion L1 may continue to use the SD (source-drain) mask with which the source and drain are manufactured, so that the bottom electrode 1402 of the photosensitive device may be kept off wires inside the display panel, and the photosensitive layer in the photosensitive unit formed subsequently may be ensured to have a certain area to receive the light reflected by the surface of the finger;

a photosensitive layer 1401 disposed on the bottom electrode 1402; the photosensitive layer 1401 may be, for example, a PIN-type photosensitive layer, which is composed of an N-type semiconductor layer (marked as N in FIG. 11), an I-type intrinsic semiconductor layer (marked as I in FIG. 11) and a P-type semiconductor layer (marked as P in FIG. 11) that are sequentially stacked on top of one another;

a protective layer 208 and a fourth interlayer insulating layer 207 that are stacked on top of one another and cover the above structures;

an anode O1 and a top electrode 1403 of the photosensitive device that are disposed on the fourth interlayer insulating layer 207 and respectively connected to the connection portion L1 and the photosensitive layer 1401 below through different via holes passing through the protective layer 208 and the fourth interlayer insulating layer 207; the anode O1 and the top electrode 1403 of the photosensitive device may be formed by using a same mask without additional patterning processes.

A pixel defining layer 205, a light-emitting layer O2, a cathode O3 and a thin film encapsulation layer 206 are sequentially disposed above the anode O1, and specific processes may be referred to the foregoing description, and details are not repeated here.

Herein, the light-emitting layer O2 of the adjacent sub-pixel overlaps with the photosensitive layer 1401 of the photosensitive device below.

In a case where the optical fingerprint recognition device is integrated into the display panel, there is a need to make the photosensitive unit have a large light-receiving area, and a full-screen array design of the photosensitive units is achieved. In this design, the leakage current in the switching transistor in the photosensitive unit is a main source of fingerprint recognition noise (i.e., interference). However, the oxide thin film transistor (oxide TFT) is far superior to an LTPS TFT in low electric leakage performance. Therefore, in the display panel O1 provided by the embodiments of the present disclosure, the driving transistor D in each sub-pixel and the switching transistor T in each photosensitive unit 14 are formed through the LTPO process.

In some embodiments, a structure of the switching transistor T in the photosensitive unit 14 is a bottom-gate structure. On this basis, a specific sectional structure of the display panel 01 along direction B-B' in FIGS. 2 and 4 is shown in FIG. 12.

Figure 12:
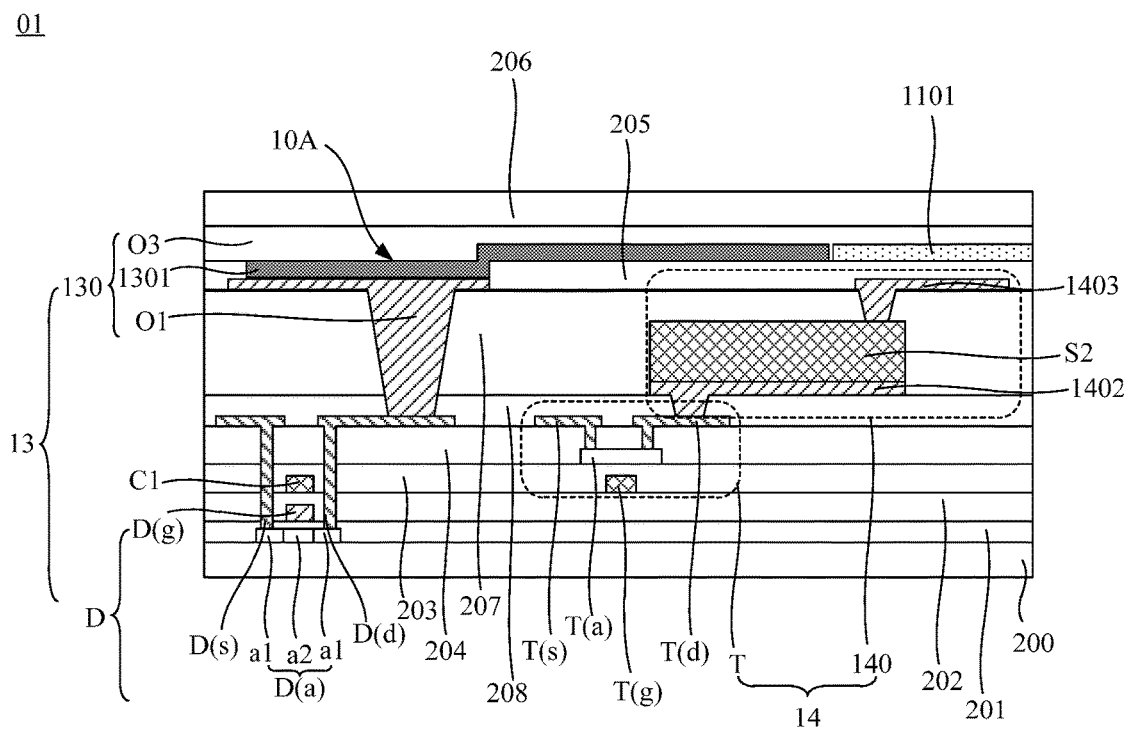
FIG. 12 is a section along direction B-B' in FIGS. 2 and 4.

It will be noted that the third sub-pixel 13 and the third light-emitting device 130 therein are specifically illustrated in FIG. 12; structures of the first sub-pixel 11 and the first light-emitting device 110 therein and structures of the second sub-pixel 12 and the second light-emitting device 120 therein are similar, which will not be repeated here.

In FIG. 12, the third light-emitting layer 1301 in the third light-emitting device 130 and the first light-emitting layer 1101 in the adjacent first light-emitting device covers the photosensitive layer (in the sectional direction, the second sub-photosensitive layer S2 in the photosensitive layer is specifically illustrated).

Herein, "A covers B" means that there is an overlapping region between an orthographic projection of A on the panel surface of the display panel 01 and an orthographic projection of B on the panel surface of the display panel 01.

As shown in FIG. 12, the specific structure of the display panel 01 is as follows:

the active layer D(a) of the driving transistor D in each sub-pixel disposed on the base substrate 200;

the gate insulating layer 201 covering the active layer D(a);

the gate D(g) of the driving transistor D in each sub-pixel disposed on the gate insulating layer 201;

the first interlayer insulating layer 202 covering the gate D(g);

the storage capacitor electrode C1 and the gate T(g) of the switching transistor T disposed on the first interlayer insulating layer 202, and the storage capacitor electrode C1 and the gate T(g) may be manufactured by using the same mask; and the storage capacitor electrode C1 and the gate D(g) are oppositely disposed, so that the storage capacitor electrode C1 and the gate D(g) form a storage capacitor;

the second interlayer insulating layer 203 covering the above structures;

the active layer T(a) of the switching transistor T disposed on the second interlayer insulating layer 203;

the third interlayer insulating layer 204 covering the above structures;

the source D(s) and the drain D(d) of the driving transistor D and the source T(s) and the drain T(d) of the switching transistor T disposed on the third interlayer insulating layer 204; the source D(s) and the drain D(d) are connected to the active layer D(a) of the driving transistor D below through different via holes each passing through the third interlayer insulating layer 204, the second interlayer insulating layer 203, the first interlayer insulating layer 202 and the gate insulating layer 201, and the gate D(g), the source D(s), the drain D(d) and the active layer D(a) constitute the driving transistor D; the source T(s) and the drain T(d) are connected to the active layer T(a) below through different via holes each passing through the third interlayer insulating layer 204, and the gate T(g), the source T(s), the drain T(d) and the active layer T(a) constitute the switching transistor T;

the protective layer 208 covering the above structures;

the bottom electrode 1402 of the photosensitive device 140 disposed on the protective layer 208;

the photosensitive layer disposed on the bottom electrode 1402 (in the sectional direction in FIG. 12, the second sub-photosensitive layer S2 is specifically illustrated), and the photosensitive layer 1401 may be, for example, a PIN-type photosensitive layer;

the fourth interlayer insulating layer 207 covering the above structures;

the anode O1 of the third light-emitting device 130 and the top electrode 1403 of the photosensitive device 140 disposed on the fourth interlayer insulating layer 207; the anode O1 is connected to the drain D(d) of the driving transistor D below through the via hole passing through the fourth interlayer insulating layer 207 and the protective layer 208, and the top electrode 1403 is connected to the second sub-photosensitive layer S2 below through the via hole passing through the fourth interlayer insulating layer 207; and the top electrode 1403, the bottom electrode 1402 and the photosensitive layer between the two constitute the photosensitive device 140;

the pixel defining layer 205 covering the above structures;

the opening portion in the pixel defining layer 205 exposing the anode O1, and the light-emitting layer 1301 in the third light-emitting device 130 is deposited in the opening portion and on the pixel defining layer 205 to connect to the anode O1 and cover the photosensitive layer in the photosensitive device 140 under the light-emitting surface 10A, and the first light-emitting layer 1101 of the first light-emitting device in the adjacent first sub-pixel also covers the photosensitive layer in the photosensitive device 140 under the light-emitting surface 10A;

an entire layer of cathode O3 covering the light-emitting layers and the pixel defining layer 205, and the entire layer of cathode O3, each independent anode O1, and the light-emitting layer between the two that is able to emit light of different colors constitute an OLED device; and the thin film encapsulation layer 206 covering the OLED device.

The entire manufacturing process of the foregoing display panel 01 includes 12 masks, which is the same as the number of the masks used in the conventional LTPS design. Therefore, the display panel 01 provided by the embodiments of the present disclosure may achieve a better LTPO design without adding the mask.

In some other embodiments, the structure of the switching transistor T in the photosensitive unit 14 is a top-gate structure. With respect to the switching transistor T having the top-gate structure, another specific sectional structure along direction B-B' in FIG. 2 and FIG. 4 is shown in FIG. 13, and the layer structures in a direction away from the base substrate 200 are sequentially:

the active layer D(a) of the driving transistor D→ the gate insulating layer 201→ the gate D(g) of the driving transistor D→ the first interlayer insulating layer 202→ the storage capacitor electrode C1 and the active layer T(a) of the switching transistor T→ the second interlayer insulating layer 203→ the source D(s) and drain D(d) of the driving transistor D, the source T(s), drain T(d) and gate T(g) of the switching transistor T→ the third interlayer insulating layer 204→ the bottom electrode 1402 of the photosensitive device 140→ the photosensitive layer of the photosensitive device 140 (in the sectional direction in FIG. 13, the second sub-photosensitive layer S2 is specifically illustrated)→ the protective layer 208→ the anode O1 of the third light-emitting device 130 and the top electrode 1403 of the photosensitive device 140→ the pixel defining layer 205→ the light-emitting layer in each sub-pixel (in the sectional direction in FIG. 13, the light-emitting layer 1301 of the third light-emitting device 130 and the first light-emitting layer 1101 of the first light-emitting device in the adjacent first sub-pixel are specifically illustrated)→ the cathode O3 as an entire layer→ the thin film encapsulation layer 206.

Specific descriptions of the above structures may be referred to the FIG. 12, and details will not be repeated here.

Figure 13:
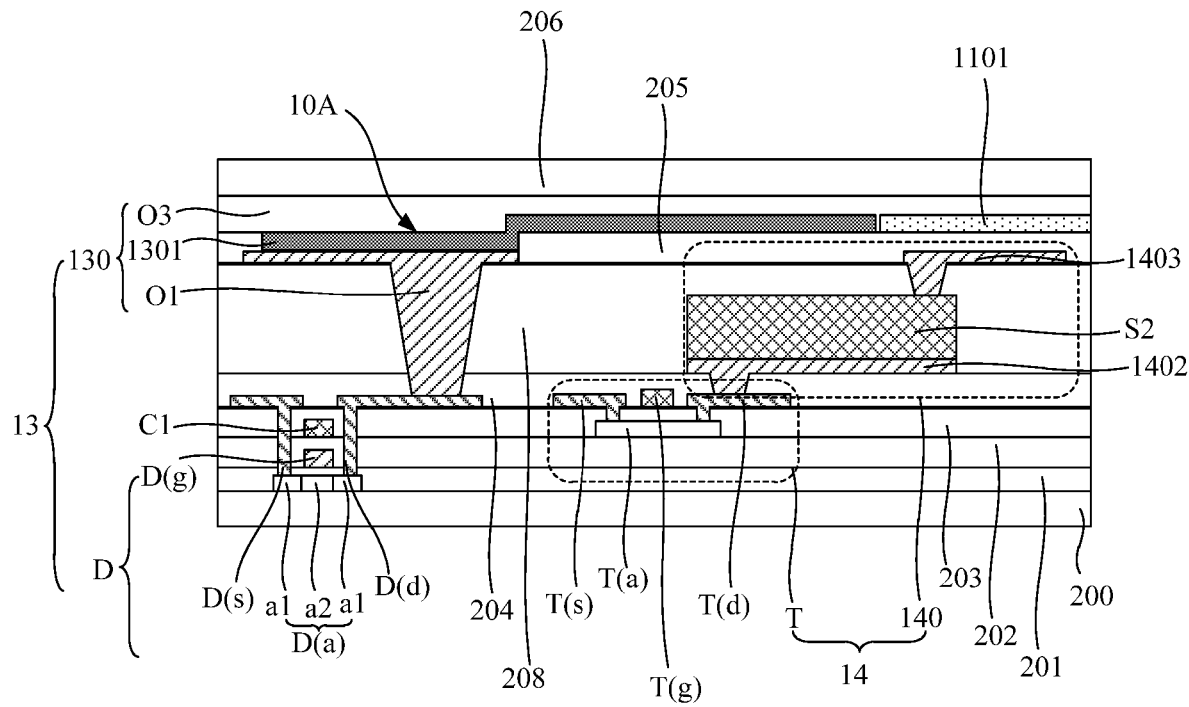
FIG. 13 is another section along direction B-B' in FIGS. 2 and 4.

In the structure of the display panel 01 illustrated in FIG. 13, since the gate T(g) of the switching transistor T is located above the active layer T(a) thereof (i.e., located at a side of the active layer T(a) away from the base substrate 200), the mask process for the gate T(g) needs to be added, and a process including 13 masks is required to complete the manufacturing of the display panel 01.

It will be noted that although in all the embodiments of the present disclosure, the drain of the driving transistor is connected to the anode and the drain of the switching transistor is connected to the bottom electrode, which is used as an example for illustration, those skilled in the art should understand that, due to the interchangeability in structure and composition of the source and drain in the transistor, the source of the driving transistor may be connected to the anode, and the source of the switching transistor may be connected to the bottom electrode, which is an equivalent transformation of the foregoing embodiments of the present disclosure.

Figure 14:
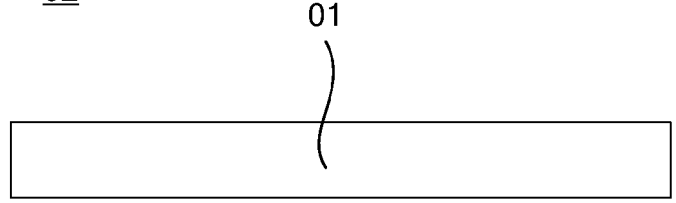
FIG. 14 is a section of a display apparatus, according to some embodiments.
Figure 1:
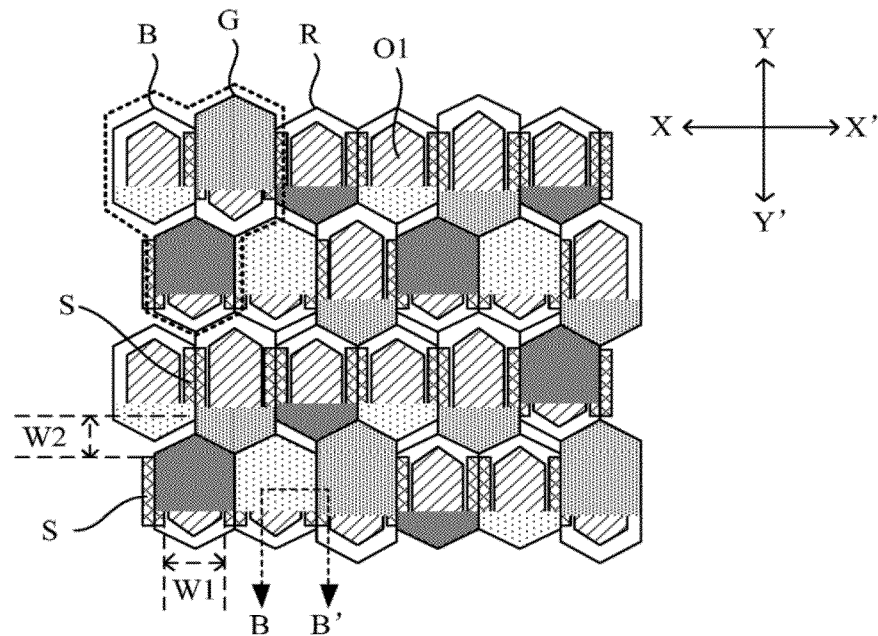
Figure 2:
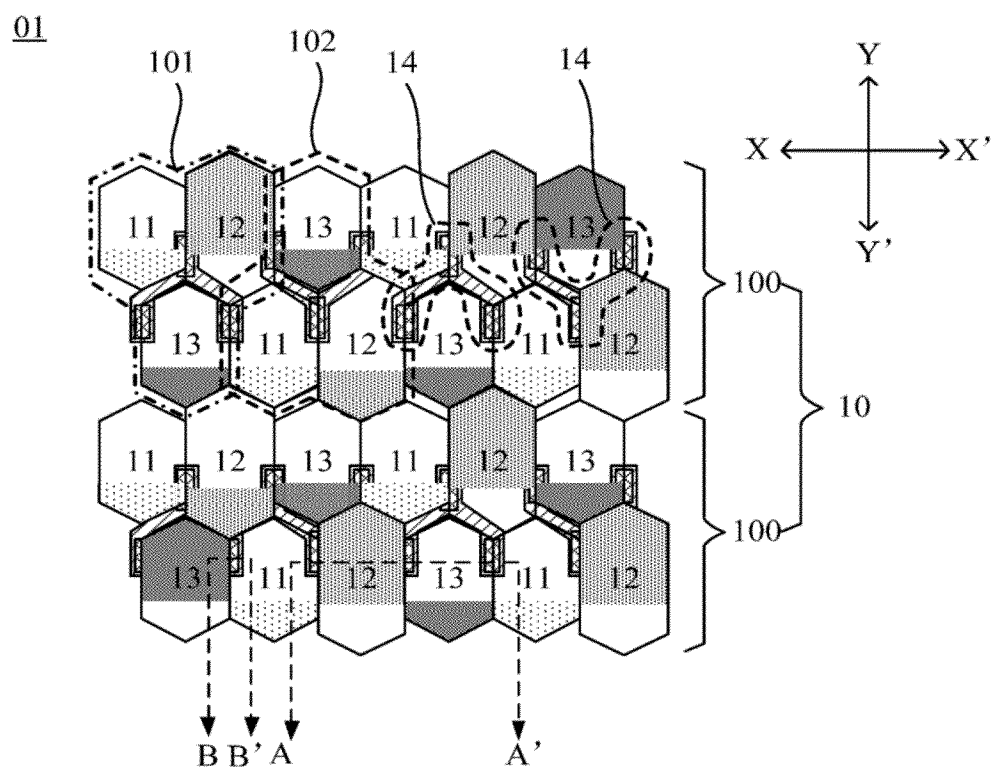
Figure 3:
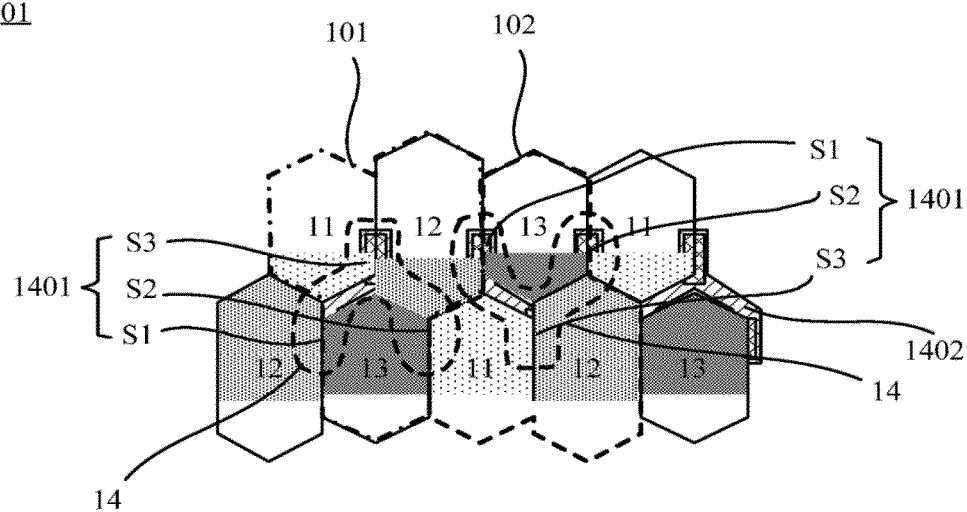
Figure 4:
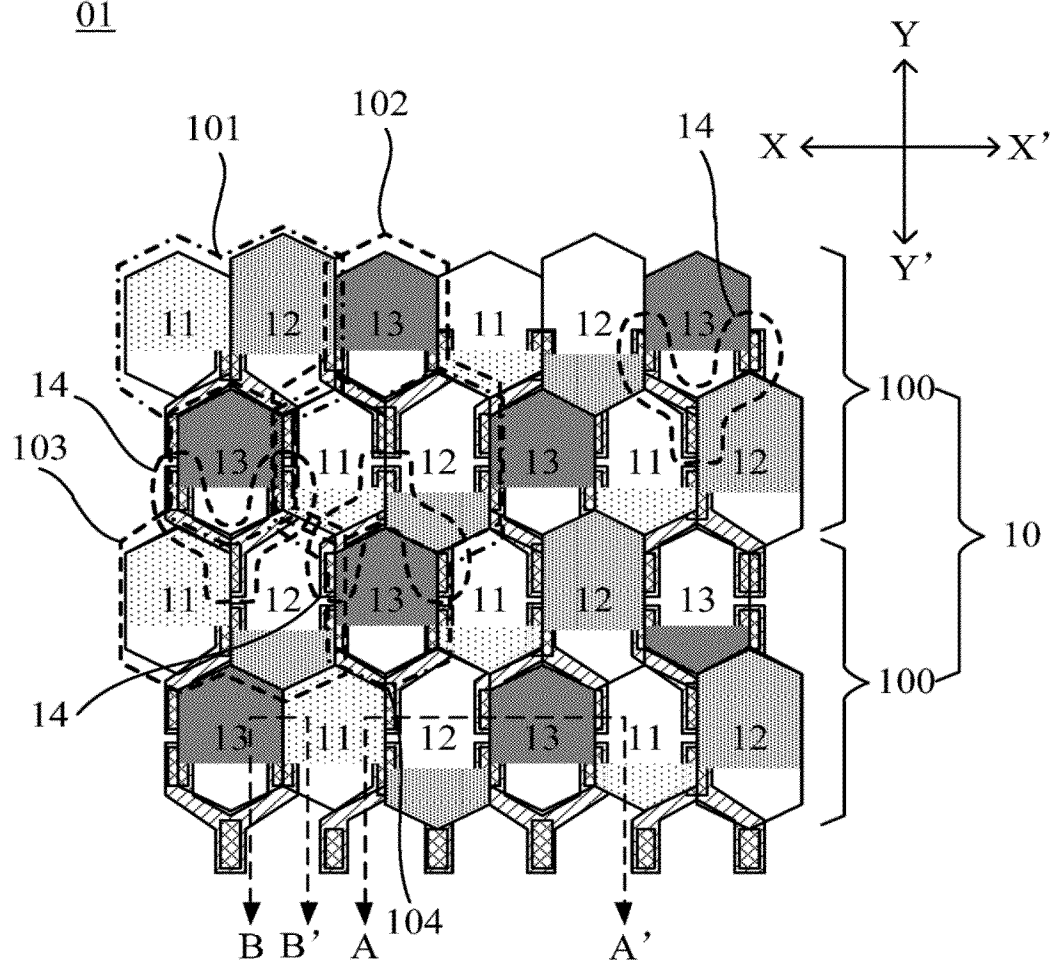
Figure 5:
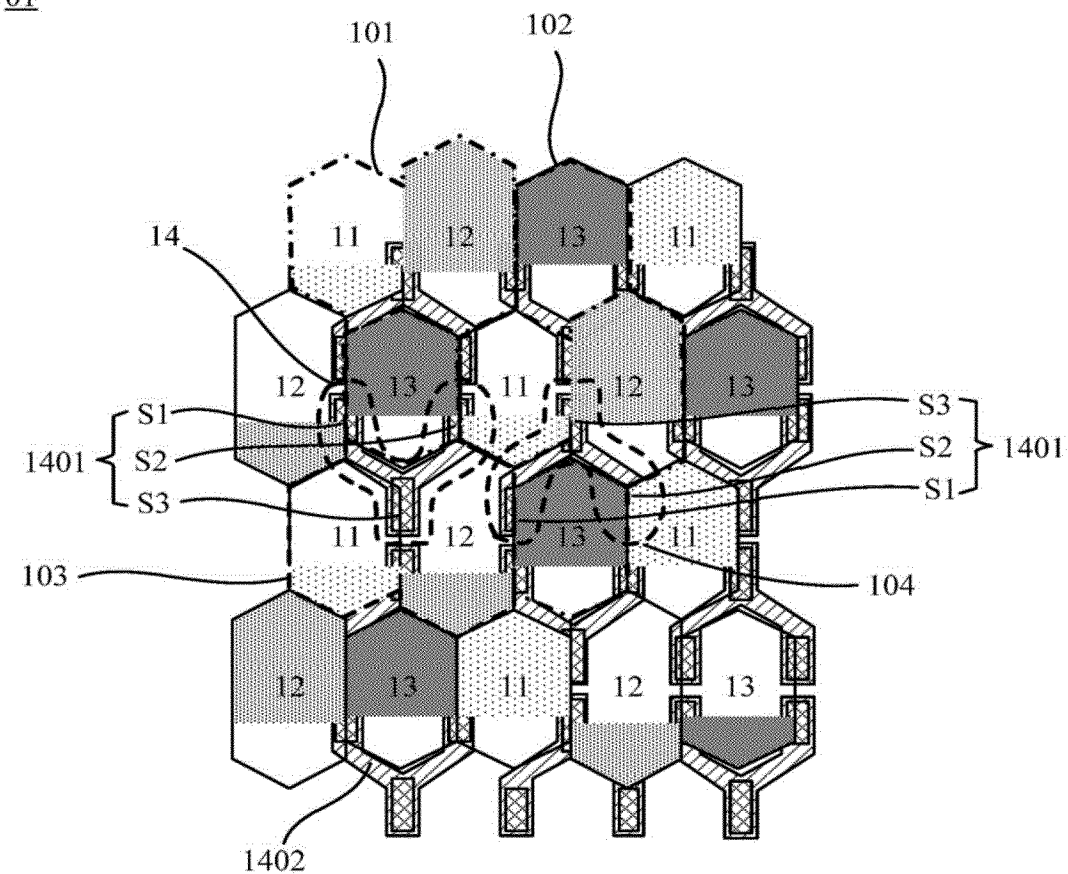
Figure 6:
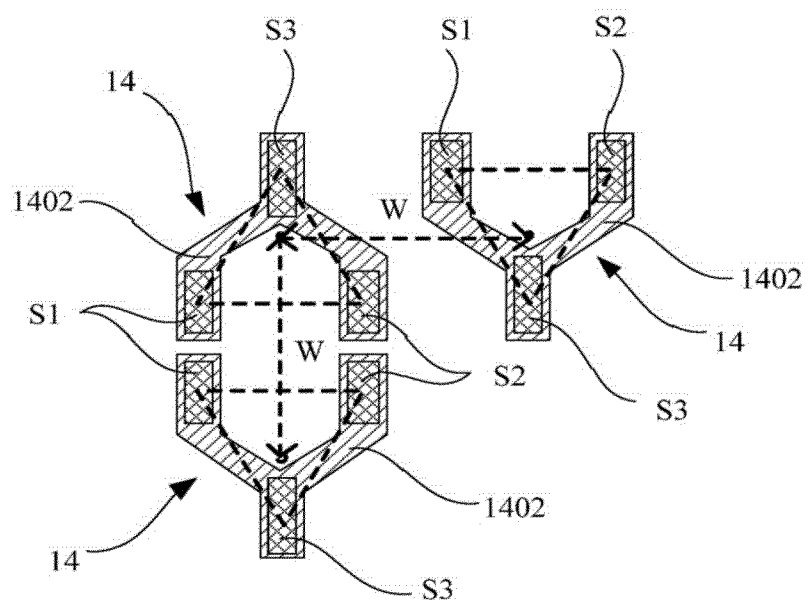
Figure 7:
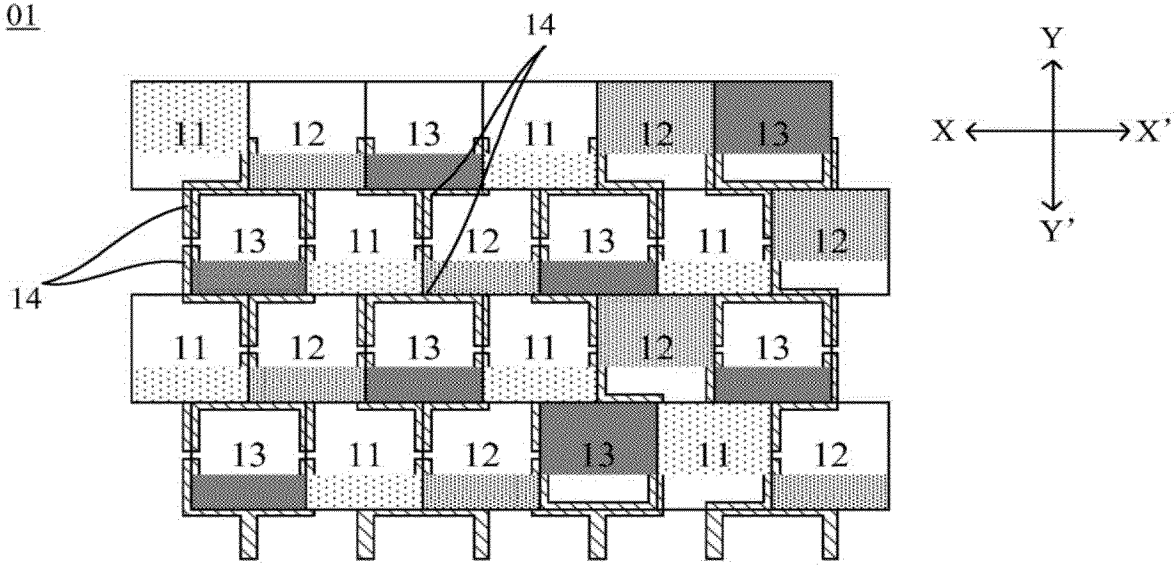
Figure 8:
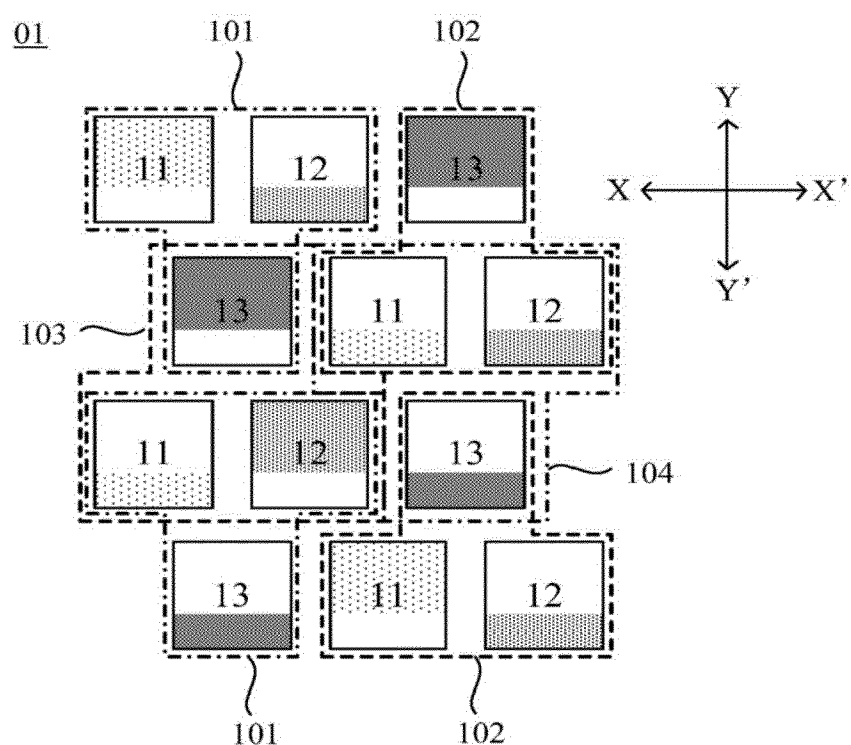

On this basis, some embodiments of the present disclosure provide a display apparatus. As shown in FIG. 14, the display apparatus 02 includes the display panel 01 according to any one of the foregoing embodiments.

In some examples, the display apparatus 02 is an OLED display apparatus integrated with an optical recognition (e.g., a fingerprint recognition) function, such as a display, a TV, a mobile phone, a tablet computer, a digital photo frame, a navigator, a smart watch, a smart bracelet or any other product or component with a display function.

In the description of the above embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

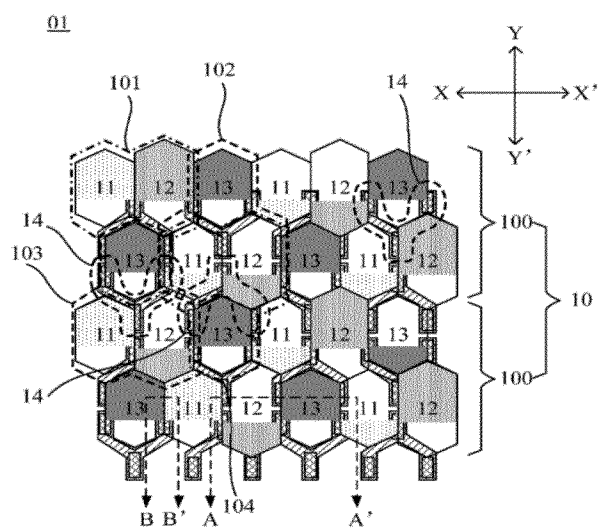

What is claimed is:

1. A display panel, comprising:
a sub-pixel array including a first sub-pixel, a second sub-pixel and a third sub-pixel that are capable of emitting light of different colors; and
a plurality of photosensitive units disposed under gaps of the sub-pixel array; wherein
each of the plurality of photosensitive units includes a photosensitive device, and the photosensitive device includes a photosensitive layer; and an orthographic projection of the photosensitive layer in the photosensitive device on a panel surface of the display panel has overlapping regions with orthographic projections of the first sub-pixel, the second sub-pixel and the third sub-pixel on the panel surface of the display panel;
wherein the sub-pixel array includes: a plurality of display groups sequentially arranged in a column direction;
each of the plurality of display groups includes: a first display sub-group and a second display sub-group alternately arranged in sequence in a row direction; and each first display sub-group and each second display sub-group each include a first sub-pixel, a second sub-pixel and a third sub-pixel distributed in two adjacent rows; and
in each display group, the first sub-pixel and the second sub-pixel in each first display sub-group are located in a same row as the third sub-pixel in each second display sub-group, and the third sub-pixel in each first display sub-group is located in a same row as the first sub-pixel and the second sub-pixel in each second display sub-group;
wherein each photosensitive layer includes: a first sub-photosensitive layer, a second sub-photosensitive layer, and a third sub-photosensitive layer;
a first photosensitive unit is disposed under a gap of each first display sub-group and a second photosensitive unit is disposed under a gap of each second display sub-group;
in a direction perpendicular to the panel surface of the display panel, in a first photosensitive unit corresponding to each first display sub-group, the first sub-photosensitive layer partially overlaps with the third sub-pixel in the first display sub-group and the second sub-pixel in a neighbouring second display sub-group, the second sub-photosensitive layer partially overlaps with the third sub-pixel in the first display sub-group and the first sub-pixel in another neighbouring second display sub-group, and the third sub-photosensitive layer partially overlaps with the first sub-pixel and the second sub-pixel in the first display sub-group; and
in the direction perpendicular to the panel surface of the display panel, in a second photosensitive unit corresponding to each second display sub-group, the first sub-photosensitive layer partially overlaps with the third sub-pixel in the second display sub-group and the second sub-pixel in a neighbouring first display sub-group, the second sub-photosensitive layer partially overlaps with the third sub-pixel in the second display sub-group and the first sub-pixel in another neighbouring first display sub-group, and the third sub-photosensitive layer partially overlaps with the first sub-pixel and the second sub-pixel in the second display sub-group; and
wherein each photosensitive unit presents a Y-shaped structure, and branches of each photosensitive layer extending in three directions are located under gaps each of which is between different adjacent sub-pixels.

2. The display panel according to claim 1, wherein
an area of an overlapping region between an orthographic projection of each photosensitive layer on the panel surface of the display panel and orthographic projections of first sub-pixels on the panel surface of the display panel is equal;
an area of an overlapping region between an orthographic projection of each photosensitive layer on the panel surface of the display panel and orthographic projections of second sub-pixels on the panel surface of the display panel is equal; and
an area of an overlapping region between an orthographic projection of each photosensitive layer on the panel surface of the display panel and an orthographic projection of the third sub-pixel on the panel surface of the display panel is equal.

3. The display panel according to claim 1, wherein the plurality of photosensitive units are evenly distributed under the gaps of the sub-pixel array.

4. The display panel according to claim 1, wherein in the column direction, the third sub-pixel in each first display sub-group and the first sub-pixel and the second sub-pixel in another neighbouring first display sub-group constitute a first virtual sub-group, and the first sub-pixel and the second sub-pixel in each second display sub-group and the third sub-pixel in another neighbouring second display sub-group constitute a second virtual sub-group;
a third photosensitive unit is disposed under a gap of each first virtual sub-group and a fourth photosensitive unit is disposed under a gap of each second virtual sub-group;
in the direction perpendicular to the panel surface of the display panel, in a third photosensitive unit corresponding to each first virtual sub-group, the first sub-photosensitive layer overlaps with the third sub-pixel in the first virtual sub-group and the second sub-pixel in a neighbouring second virtual sub-group, the second sub-photosensitive layer overlaps with the third sub-pixel in the first virtual sub-group and the first sub-pixel in another neighbouring second virtual sub-group, and the third sub-photosensitive layer overlaps with the first sub-pixel and the second sub-pixel in the first virtual sub-group;
in the direction perpendicular to the panel surface of the display panel, in a fourth photosensitive unit corresponding to each second virtual sub-group, the first sub-photosensitive layer overlaps with the third sub-pixel in the second virtual sub-group and the second sub-pixel in a neighbouring first virtual sub-group, the second sub-photosensitive layer overlaps with the third sub-pixel in the second virtual sub-group and the first sub-pixel in another neighbouring first virtual sub-group, and the third sub-photosensitive layer overlaps with the first sub-pixel and the second sub-pixel in the second virtual sub-group.

5. The display panel according to claim 4, wherein an area of an overlapping region between each first sub-photosensitive layer and a corresponding second sub-pixel is equal, and an area of an overlapping region between each first sub-photosensitive layer and a corresponding third sub-pixel is equal;
- an area of an overlapping region between each second sub-photosensitive layer and a corresponding first sub-pixel is equal, and an area of an overlapping region between each second sub-photosensitive layer and a corresponding third sub-pixel is equal; and
- an area of an overlapping region between each third sub-photosensitive layer and a corresponding first sub-pixel is equal, and an area of an overlapping region between each third sub-photosensitive layer and a corresponding second sub-pixel is equal.

6. The display panel according to claim 4, wherein in a column of the first display sub-groups, a gap between the first sub-pixel and the second sub-pixel is aligned with a center line of the third sub-pixel in the column direction;
- in a column of the second display sub-groups, a gap between the first sub-pixel and the second sub-pixel is aligned with a center line of the third sub-pixel in the column direction; and
- in each photosensitive unit, a center of the first sub-photosensitive layer, a center of the second sub-photosensitive layer and a center of the third sub-photosensitive layer are connected to form a virtual triangle;
- wherein a distance between middle points of two adjacent virtual triangles in the row direction is equal to a distance between middle points of two adjacent virtual triangles in the column direction, and a middle point of each virtual triangle is a middle point of a vertical line from a vertex corner where the center of the third sub-photosensitive layer is located to an opposite side.

7. The display panel according to claim 4, wherein in the photosensitive unit, the first sub-photosensitive layer, the second sub-photosensitive layer and the third sub-photosensitive layer included in the photosensitive layer are not connected to each other.

8. The display panel according to claim 7, wherein the photosensitive device in the photosensitive unit further includes: a bottom electrode and a top electrode disposed on both sides of the photosensitive layer in the direction perpendicular to the panel surface of the display panel;
- orthographic projections of the first sub-photosensitive layer, the second sub-photosensitive layer and the third sub-photosensitive layer on the panel surface of the display panel are within a range of an orthographic projection of the bottom electrode on the panel surface of the display panel, and portions of the bottom electrode corresponding to the first sub-photosensitive layer, the second sub-photosensitive layer and the third sub-photosensitive layer are connected to each other; and
- orthographic projections of the first sub-photosensitive layer, the second sub-photosensitive layer and the third sub-photosensitive layer on the panel surface of the display panel are within a range of an orthographic projection of the top electrode on the panel surface of the display panel, and portions of the top electrode corresponding to the first sub-photosensitive layer, the second sub-photosensitive layer and the third sub-photosensitive layer are connected to each other.

9. The display panel according to claim 1, wherein in the direction perpendicular to the panel surface of the display panel, patterns of the first sub-pixel, the second sub-pixel and the third sub-pixel are all hexagons.

10. The display panel according to claim 1, wherein the display panel is a fingerprint recognition display panel.

11. The display panel according to claim 1, wherein the first sub-pixel includes a first light-emitting device, and a portion of the first sub-pixel overlapping with the photosensitive layer is a light-emitting layer of the first light-emitting device in the first sub-pixel;
- the second sub-pixel includes a second light-emitting device; and a portion of the second sub-pixel overlapping with the photosensitive layer is a light-emitting layer of the second light-emitting device in the second sub-pixel; and
- the third sub-pixel includes a third light-emitting device, and a portion of the third sub-pixel overlapping with the photosensitive layer is a light-emitting layer of the third light-emitting device in the third sub-pixel.

12. The display panel according to claim 11, wherein each first sub-pixel, each second sub-pixel and each third sub-pixel each further include: a driving transistor electrically connected to a corresponding light-emitting device therein; and
- a photosensitive unit further includes a switching transistor electrically connected to the photosensitive device in the photosensitive unit;
- wherein a material of an active layer in the driving transistor is different from a material of an active layer in the switching transistor, and the active layer in the switching transistor is made of an oxide semiconductor material.

13. The display panel according to claim 12, wherein the active layer in the driving transistor is made of a low-temperature polysilicon material.

14. A display apparatus, comprising the display panel according to claim 1.

* * * * *

UNITED STATES PATENT AND TRADEMARK OFFICE
CERTIFICATE OF CORRECTION

PATENT NO. : 12,048,229 B2  
APPLICATION NO. : 18/182894  
DATED : July 23, 2024  
INVENTOR(S) : Yuzhen Guo et al.

Page 1 of 6

It is certified that error appears in the above-identified patent and that said Letters Patent is hereby corrected as shown below:

On the Title Page

Delete the title page and substitute therefore with the attached title page consisting of the corrected illustrative figure.

In the Drawings

Please replace FIGS. 1-2, FIGS. 3-4, FIGS. 5-6, and FIGS. 7-8 with the attached drawing sheets.

Signed and Sealed this  
Twenty-ninth Day of April, 2025

Coke Morgan Stewart  
*Acting Director of the United States Patent and Trademark Office*

(12) United States Patent
Guo et al.

(10) Patent No.: US 12,048,229 B2
(45) Date of Patent: *Jul. 23, 2024

(54) DISPLAY PANEL AND DISPLAY APPARATUS

(71) Applicant: BOE TECHNOLOGY GROUP CO., LTD., Beijing (CN)

(72) Inventors: Yuzhen Guo, Beijing (CN); Xiaochuan Chen, Beijing (CN); Lei Wang, Beijing (CN); Haisheng Wang, Beijing (CN); Yingming Liu, Beijing (CN); Lijun Zhao, Beijing (CN); Changfeng Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/182,894

(22) Filed: Mar. 13, 2023

(65) Prior Publication Data

US 2023/0217785 A1 Jul. 6, 2023

Related U.S. Application Data

(63) Continuation of application No. 17/041,915, filed as application No. PCT/CN2019/128345 on Dec. 25, 2019, now Pat. No. 11,653,548.

(30) Foreign Application Priority Data

Jan. 30, 2019 (CN) .......................... 201910093793.9

(51) Int. Cl.
*H10K 59/35* (2023.01)
*G06V 40/13* (2022.01)
(Continued)

(52) U.S. Cl.
CPC .......... *H10K 59/65* (2023.02); *G06V 40/1318* (2022.01); *H10K 59/353* (2023.02); *H10K 59/60* (2023.02)

(58) Field of Classification Search
CPC .......................... H10K 59/65; G06V 40/1318
See application file for complete search history.

(56) References Cited

U.S. PATENT DOCUMENTS 5,666,177 A 9/1997 Hsieh et al.
11,152,432 B1* 10/2021 Liu ..................... H10K 59/353
(Continued)

FOREIGN PATENT DOCUMENTS

CN 103685992 A 3/2014
CN 103716558 A 4/2014
(Continued)

OTHER PUBLICATIONS

Extended European Search Report for corresponding European Application No. 19912815.8, dated Sep. 29, 2022, 8 pages.
(Continued)

*Primary Examiner* — Eric K Ashbahian
(74) *Attorney, Agent, or Firm* — Dority & Manning, P.A.

(57) ABSTRACT

A display panel includes a sub-pixel array and a plurality of photosensitive units. The sub-pixel array includes a first sub-pixel, a second sub-pixel and a third sub-pixel that are capable of emitting light of different colors. The plurality of photosensitive units are disposed under gaps of the sub-pixel array. Each of the plurality of photosensitive units includes a photosensitive device, and the photosensitive device includes a photosensitive layer; and an orthographic projection of the photosensitive layer in the photosensitive device on a panel surface of the display panel has overlapping
(Continued)